United States Patent [19]
Suzuki et al.
[11] Patent Number: 4,921,317
[45] Date of Patent: May 1, 1990

[54] INFRARED ABSORBENT COMPRISING A METAL COMPLEX COMPOUND CONTAINING TWO THIOLATO BIDENTATE LIGANDS

[75] Inventors: Yoshiaki Suzuki; Gouichi Hayashi, both of Minami-ashigara, Japan

[73] Assignee: Fuji Photo Film Co., Ltd., Kanagawa, Japan

[21] Appl. No.: 198,463

[22] Filed: Jul. 6, 1988

Related U.S. Application Data

[62] Division of Ser. No. 754,759, Jul. 15, 1985, Pat. No. 4,763,966.

[30] Foreign Application Priority Data

| | | | |
|---|---|---|---|
| Jul. 16, 1984 | [JP] | Japan | 59-147393 |
| Aug. 4, 1984 | [JP] | Japan | 59-163980 |
| Aug. 28, 1984 | [JP] | Japan | 59-177523 |
| Sep. 13, 1984 | [JP] | Japan | 59-192412 |
| Sep. 27, 1984 | [JP] | Japan | 59-202692 |

[51] Int. Cl.[5] .......... F21V 9/04; G02B 5/20

[52] U.S. Cl. .......... 350/311; 106/286.7; 106/22; 430/944; 252/587; 544/4; 546/6; 548/107; 549/3

[58] Field of Search .......... 350/1.1, 311, 353; 106/286.7, 22; 430/372, 510, 944; 252/587, 582; 549/3, 36, 59, 62, 64; 544/4; 546/6; 548/107

[56] References Cited

U.S. PATENT DOCUMENTS

| | | | |
|---|---|---|---|
| 2,651,648 | 2/1956 | Meyer | 556/113 |
| 2,738,364 | 3/1956 | Reppe et al. | 560/206 |
| 2,842,578 | 7/1958 | Pikl | 556/136 |
| 3,035,089 | 5/1962 | Dunn | 560/206 |
| 3,255,195 | 6/1966 | Benson | 546/8 |
| 3,345,380 | 10/1967 | Hodgson | 549/36 |
| 3,398,167 | 8/1968 | Mahler | 556/20 |
| 3,432,300 | 3/1969 | Lestina et al. | 96/74 |
| 3,494,899 | 2/1970 | Brown | 549/36 |
| 3,505,372 | 4/1970 | Josh et al. | 556/118 |
| 3,743,964 | 7/1973 | Drexhage et al. | 252/582 |
| 3,806,462 | 2/1972 | Bloom | 252/600 |
| 3,859,396 | 1/1975 | Oude Alink | 549/36 |
| 3,875,199 | 4/1975 | Bloom | 252/587 |
| 4,050,938 | 9/1977 | Smith, Jr. et al. | 96/84 R |
| 4,062,867 | 12/1977 | Bloom | 549/3 |
| 4,306,875 | 12/1981 | De Feo et al. | 8/471 |
| 4,505,749 | 3/1985 | Kanekiyo et al. | 106/20 |
| 4,730,902 | 3/1988 | Suzuki et al. | 350/311 |
| 4,761,181 | 8/1988 | Suzuki | 106/22 |
| 4,763,966 | 8/1988 | Suzuki et al. | 350/1.1 |
| 4,767,571 | 8/1988 | Suzuki et al. | 252/587 |
| 4,791,023 | 12/1988 | Suzuki et al. | 428/336 |
| 4,851,322 | 7/1989 | Inagaki et al. | 430/270 |

FOREIGN PATENT DOCUMENTS

| | | | |
|---|---|---|---|
| 20896 | 1/1981 | European Pat. Off. | 549/36 |
| 2456075 | 7/1975 | Fed. Rep. of Germany | 252/582 |
| 1442450 | 7/1966 | France | 549/36 |
| 2084997 | 12/1971 | France | 252/582 |
| 0224320 | 6/1984 | German Democratic Rep. | 549/36 |
| 49-31748 | 7/1974 | Japan | 252/582 |
| 57-21458 | 2/1982 | Japan | 252/587 |
| 61-32003 | 2/1986 | Japan | 252/582 |

OTHER PUBLICATIONS

Isett et al., "Properties . . . ", Nov. 15, 1980, Phys. Rev. B, pp. 4739–4743.

Umezawa et al., "Visible Light . . . ", J. Electrochem. Soc., Oct. 1982, pp. 2378–2380.

McCleverty et al., "Transition Metal . . . ", J. of Amer. Chem. Soc., Nov. 22, 1967, 6082–6092.

Forbes et al., "Dithiotropolonates . . . ", JACS, Apr. 22, 1970, pp. 2231–2336.

*Primary Examiner*—Mary C. Lee
*Assistant Examiner*—Catherine S. Kilby Scalzo
*Attorney, Agent, or Firm*—Birch, Stewart, Kolasch & Birch

[57] ABSTRACT

The present invention relates to a metal complex compound useful in an infrared absorbent prepared by coordinating two bidentate ligands of the following formula (iii):

(Abstract continued on next page.)

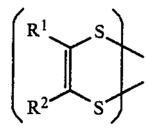

(iii)

wherein $R^1$ and $R^2$ each independently represents a hydrogen atom, a cyano group, or a substituted or unsubstituted alkyl, aryl or heterocyclic group, which may be the same or different.

The present invention is further directed to an infrared absorbing composition comprising a metal complex compound prepared by coordinating two bidentate ligands of formula (iii) above to a center metal and neutralizing a complex ion with a cation.

The present invention is also directed to an infrared absorbing article which comprises a metal complex compound prepared by coordinating two bidentate ligands of formula (iii) above to a center metal and neutralizing such a complex with a phosphonium cation.

23 Claims, 5 Drawing Sheets

INFRARED ABSORBENT COMPRISING A METAL COMPLEX COMPOUND CONTAINING TWO THIOLATO BIDENTATE LIGANDS

This application is a divisional of copending application Ser. No. 754,759, filed on July 15, 1985 now U.S. Pat. No. 4,763,966.

BACKGROUND OF THE INVENTION (1) Field of the Invention

This invention relates to a novel-infrared absorbent for absorbing near infrared rays having a wavelength of 700–1500 nm or for absorbing a far infrared rays which scarcely interfere with the transmission of visible light.

(2) Description of the Prior Art

Heretofore, various applications of an infrared absorbing material capable of selectively absorbing rays of far infrared light or of near infrared light having a wavelength of 700–1500 nm have been proposed. The following five examples show conventional primary applications of an infrared absorbing material.

(1) Safelight filter for infrared-sensitive materials:

Recently, there have been developed many silver halide light sensitive materials (which will be hereinafter referred to as "light sensitive materials") which are sensitive to rays of far infrared light or near infrared light having a wavelength of 700 nm or more. That is, light sensitive materials are made to have an infrared sensitivity irrespective of any distinction between black and white photographs or color photographs including a normal-type, instant-type and thermal developed-type photographs. These filter materials are useful for an artificial color photograph for a resource search or they may be used or exposed with a light emission diode capable of emitting a light in an infrared area.

Conventionally, a safelight filter for a panchromatic photosensitive material has been used for such infrared-sensitive materials.

(2) Control of the growth of plants:

It has been long known that a so-called morphogenesis with regard to growth and differentiation of plants such as germination of seed, extension of stem, development of leaf, budding of flower and formation of tuber is influenced by a light, and it has been studied as a photomorphogenesis. It is also known that a red light having a wavelength of about 660 nm and a red light having a wavelength of about 720–730 nm antagonistically function to each other, and therefore the time of flowering or earing, or the extent of growth or yield of fruits can be varied by changing a proportion of both types of light. Such a study has been made by controlling a spectral energy distribution of a light source lamp and a filter in combination. Therefore, it was difficult to carry out a test in a large-scale green house or farm.

If a plastic film capable of selectively absorbing rays having a wavelength of 700 nm or more is obtainable, it will be possible to control a spectral energy distribution of light to adapt the above-mentioned principle to an actual productive cite, thereby providing great progress and profit to aggricultural equipment. For example, it is expected that earing time may be delayed or growth may be controlled by covering plants with a near-infrared absorbing film at a specific time to cut-off a light having a wavelength of 700 nm or more. (See "Chemical Control of Plants", Katsumi Ineda, Vol. 6, No. 1 (1971))

(3) Cut-off of heat radiation:

Solar radient energy rays of near infrared and infrared areas having a wavelength of 800 nm or more are absorbed by an object and converted to a thermal energy. In addition, a large part of its energy distribution is converged at a near infrared area having a wavelength of 800–2000 nm. Accordingly, a film capable of selectively absorbing rays of a near infrared light is remarkably effective for the cut-off of solar energy, and it is possible to suppress an increase in temperature in a room admitting visible light. Such a film may be adapted to a window of a house, office, store, automobile and airplane, etc. as well as a gardening green house. In particular, in a green house, temperature control is very important and if the temperature is excessively elevated, the plants will be greatly damaged causing them to wither. Accordingly, when the near infrared absorbing film is used, the temperature control may be rendered easy, and a new technique such as retarded cultivation in summer may be developed. A conventional heat radiation cutting-off material includes a thin metallic layer deposited on a surface of a plastic film or an inorganic compound, e.g., FeO dispersed in a glass.

(4) Cut filter of infrared rays harmful to tissues of human eyes:

Infrared rays contained in sun light or in light radiated in welding have a harmful influence to the tissues of human eyes. One of the primary applications of the infrared cut filter is an application to spectacles for protecting the human eyes from rays of light containing such harmful infrared rays, e.g., sunglasses and protecting glasses in welding.

(5) Infrared cut filter for semiconductor light receiving element:

In another field where development of this kind of infrared absorbing plastics is most intensively desired, the infrared absorbing plastics are adapted to an infrared cut filter for a photosensor to make the spectral sensitivity of a semiconductor light receiving element such as silicon photo diode (which will be hereinafter referred to as SPD) approach the relative spectral sensitivity curve.

Presently, SPD is mainly used as a light receiving element of a photosensor used in an automatic exposure meter for a camera or the like. FIG. 2 shows a graph of the relative spectral sensitivity curve and that of a relative value of an output of SPD to each wavelength.

In order to use SPD for an exposure meter, it is required to cut-off light in an infrared area which is not sensitive to human eyes and to make the spectral sensitivity curve of SPD shown in FIG. 2 approach the relative spectral sensitivity curve. Particularly, as an output of SPD is large with light having a wavelength of 700–1100 nm, and the eyes are insensitive to such light, this is one of the factors for the malfunctioning of the exposure meter. Therefore, if it is possible to use an infrared absorbing plastic film suppressing an absorption of a visible light area, while permitting an absorption of an infrared light area in the entire range of 700–1100 nm, the light transmittance in a visible area may be increased and an output of SPD may be also increased. Thus, it will be possible to apparently remarkably improve the performance of the exposure meter.

Conventionally, this kind of photosensor has been particularly used by mounting an infrared cut filter made of glass containing an inorganic infrared absorbent to a front surface of SPD.

Moreover, in general organic dyestuff infrared absorbents of the prior art are unsatisfactory in practical use because of their low light fastness and heat fastness.

Further, regarding the above-mentioned applications, filter materials as previously used have the following shortcomings.

The safelight filter for the panchromic photosensitive material in the afore-mentioned applications (1) permits green light having a high luminosity factor to be partially transmitted, and also permits a large quantity of infrared light to be transmitted to cause fogging. For this reason, such a safelight filter has not been able to achieve its object for infrared sensitive materials.

In the applications in (3), the metallic layer deposited plastic film or the FeO dispersed glass functions to intensively absorb not only infrared light but also visible light to cause reduction in inside luminance. For this reason, such a plastic film or glass is not suitable for agricultural uses because of the lack of an absolute quantity of sunshine. Especially, the filter material for the growth control of plants in the applications in (2) is required to selectively absorb a light having a wavelength of 700–750 nm, and therefore the metallic layer deposited film is quite unsuitable for such an object.

Furthermore, in the applications in (5), the infrared cut filter using the infrared absorbent containing an inorganic substance is relatively fast to heat and light, but light transmittance in a visible area is low. To cope with this, the sensitivity of SPD was intended to be increased. However, an increase in the sensitivity of SPD results in an increase in the leak current which causes a malfunction of the photosensor, resulting in a big problem in reliability. Additionally, since the infrared cut filter contains an inorganic substance, there is a lack in the flexibility in production of a photosensor and a difficulty in improving the production process. Further, the infrared cut filter containing an inorganic substance causes a high production cost which results in a great increase in the cost of the photosensor.

In this manner, although the photosensor using the conventional cut filter containing an inorganic substance has a spectral sensitivity similar to the spectral luminous efficiency curve, it has a remarkable defect in such a viewpoint as the reduction in an operational performance, increase in the production cost and difficulty in improving the production process.

Moreover, the conventional near-infrared absorbing plastic film containing the infrared absorbent of a complex containing qauternary ammonium group does not have sufficient solubility of the infrared absorbent in an organic solvent, which was a restriction in preparing a thin plastic film layer.

In other words, the SPD filter as mentioned above is desired to have a much smaller thickness and a good absorption efficiency of infrared rays. To this end, it is necessary to disperse a large quantity of infrared absorbent in resin. Therefore, the infrared absorbent having a small solubility in an organic solvent has not met the above requirements.

Furthermore, a conventional near-infrared absorbing plastic film containing a metal complex as an infrared absorbent has a short wavelength or absorption maximum, and therefore it was unsuitable for application in a light receiving element of a semiconductor laser which is increasing its uses.

SUMMARY OF THE INVENTION

The present invention provides an infrared absorbent comprising a metal complex compound prepared by coordinating two thiolato bidentate ligands to a center metal selected from the group consisting of a nickel, copper, cobalt, palladium and platinum and neutralizing a complex ion with a cation.

Accordingly, it is a primary object of the present invention to provide a near-infrared absorbent which has a high solubility to an organic solvent and a good compatibility with a film forming binder, an infrared absorbent composition containing the same and an infrared absorbing material using the same (e.g., optical materials such as an optical filter).

It is another object of the present invention to provide an infrared absorbent which can be included in an infrared absorbent material (e.g., optical filter) which has a high cut-off ability against near infrared rays per unit thickness, a high transmittance of visible light, and a good fastness to heat and light.

It is another object of the present invention to provide an infrared absorbent which has an absorption maximum in a wavelength range of 700 nm or more, especially, in a wavelength range of 900 nm or more.

It is a further object of the present invention to provide an infrared absorbent which is stable to chemicals, especially, acids.

It is a further object of the present invention to provide an infrared absorbent which is used for various applications including the afore-mentioned applications, that is, for a safelight filter for infrared-sensitive materials, control of growth of plants, cut-off of thermic rays, cut off filter for infrared rays harmful to the tissues of human eyes, cut off filter of infrared rays for semiconductor light receiving elements or color solid image pick-up elements, and cut off filter of infrared rays for an optelectronic integrated circuit incorporating electrical and optical elements in the same substrate.

Other and further objects, features and advantages of the invention will appear more fully from the following description taken in connection with the accompanying drawings.

DETAILED DESCRIPTION OF THE INVENTION

Figure 1:
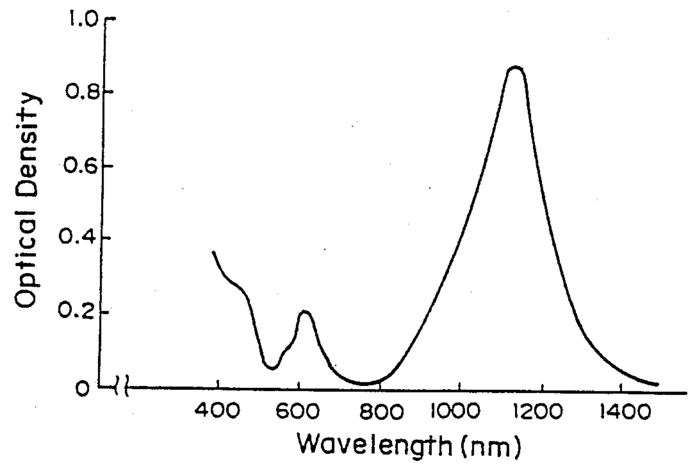
FIG. 1 is a graph of an optical density curve of the optical filter obtained in Example 1.
Figure 2:
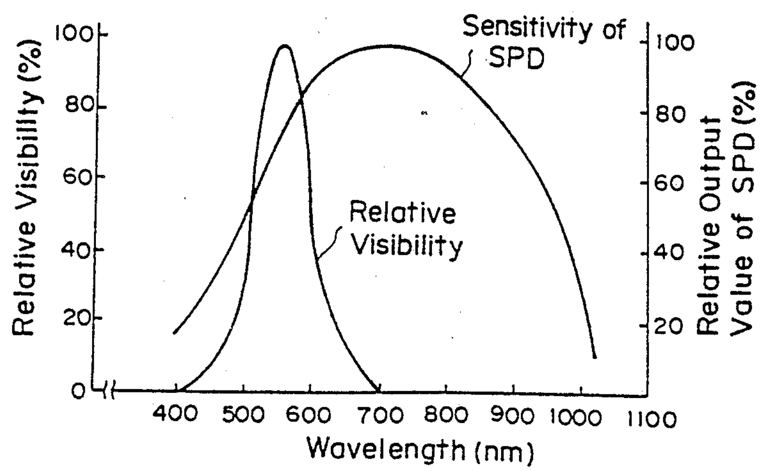
FIG. 2 is a graph of relative sensitivity curves of human eyes and SPD to a light wavelength.

The present invention provides an infrared absorbent comprising a metal complex compound prepared by coordinating two bidentate ligands selected from the following groups to a center metal selected from a nickel, copper, cobalt, palladium and platinum and neutralizing such a complex with a cation:

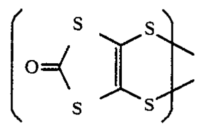

(i)

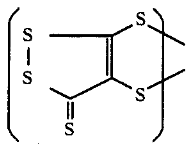

(ii)

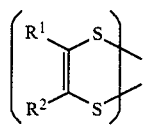

(iii)

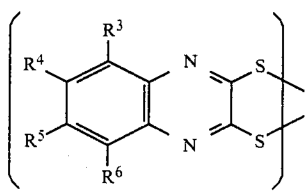

(iv)

wherein, $R^1$ and $R^2$ each independently represents a hydrogen atom, cyano group or a substituted or unsubstituted alkyl, aryl or heterocyclic group, which may be the same or different; $R^3$ to $R^6$ each independently represents a hydrogen atom, halogen atom, cyano group, hydroxyl group, or a substituted or unsubstituted alkyl, aryl, cycloalkyl or heterocyclic group which may be bonded through a divalent connecting group to a benzene ring, or a group of nonmetal atoms forming a substituted or unsubstituted five-membered or six-membered ring by bonding of $R^3$ and $R^4$, $R^4$ and $R^5$, or $R^5$ and $R^6$; $R^3$ to $R^6$ may be the same or different.

Further, the present invention provides an infrared absorbent composition and material comprising at least one of the above-defined infrared absorbents.

Examples of a preferred infrared absorbent according to the present invention may include the compounds as represented by the following general formulae [I] and [II]:

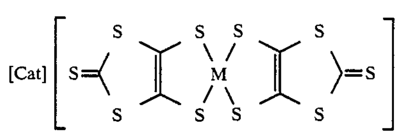

[I]

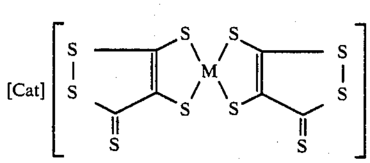

[II]

wherein [Cat] represents a cation necessary for neutralizing a complex; $M_1$ and $M_2$ each represents a nickel, copper, cobalt, palladium or platinum.

In the compounds as represented by the abovementioned general formulae [I] and [II], examples of an inorganic cation represented by [Cat] may include alkali metal (e.g., Li, Na, K), alkali earth metal (e.g., Mg, Ca, Ba) or $NH_4^+$.

Examples of an organic cation may include quaternary ammonium ion, quaternary pyridinium ion, quaternary phosphonium ion or iminium ion.

A preferred cation of the cations, [Cat], may be represented by the following general formulae [III-a], [III-b], [III-c], [III-d] or [III-e]. These cations are preferable also for the compounds as represented by general formulae [IV]–[VII] described later:

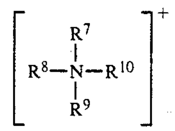

[III-a]

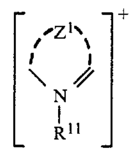

[III-b]

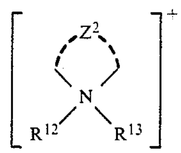

[III-c]

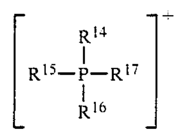

[III-d]

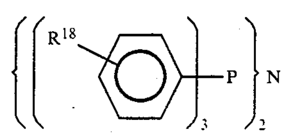

[III-e]

wherein, $R^7$ to $R^{17}$ each independently represents a substituted or unsubstituted alkyl group containing 1 to 20 carbon atoms, or a substituted or unsubstituted aryl group containing 6 to 14 carbon atoms; $Z^1$ and $Z^2$ each represents a group of nonmetal atoms which are bonded to a nitrogen or phosphorus atom in the formulae to form a five-membered or six-membered ring.

Examples of the alkyl group containing 1 to 20 carbon atoms may include e.g., a methyl, ethyl, n-butyl, iso-amyl, n-dodecyl and n-octadecyl group. Examples of the aryl group containing 6 to 14 carbon atoms may include e.g., a phenyl group, tolyl group and α-naphtyl group. Examples of a substituent which may be introduced in the alkyl or aryl group may include a cyano group, an alkyl group containing 1 to 20 carbon atoms (e.g., a methyl, ethyl, n-butyl and n-octyl group), an aryl group containing 6 to 14 carbon atoms (e.g., a phenyl, tolyl and α-naphtyl group), an acyloxy group containing 2 to 20 carbon atoms (e.g., an acetoxy, benzoyloxy group and p-methoxybenzoyloxy group), an alkoxy group containing 1 to 6 carbon atoms (e.g., a methoxy, ethoxy, propoxy and butoxy group), an aryloxy group (e.g., a phenoxy and tolyloxy group), an aralkyl group (e.g., a benzyl, phenethyl and anisyl group), an alkoxycarbonyl group (e.g., a methoxycarbonyl, ethoxycarbonyl and n-butoxycarbonyl group), an aryloxycarbonyl group (e.g., a phenoxycarbonyl and tolyloxycarbonyl group), an acyl group (e.g., an acetyl and benzoyl group), an acylamino group (e.g., an acetylamino and benzoylamino group), a carbamoyl group (e.g., a N-ethylcarbamoyl and N-phenylcarbamoyl group), an alkylsulfonylamino group (e.g., a methylsulfonylamino and phenylsulfonylamino group), a sulfamoyl group (e.g., a N-ethylsulfamoyl and N-phenylsulfamoyl group), and a sulfonyl group (e.g., a mesyl and a tosyl group).

$R^{18}$ represents a hydrogen atom, substituted or unsubstituted alkyl group, or substituted or unsubstituted alkoxy group. $R^{18}$ is preferably a hydrogen atom, a methyl group or a methoxy group.

$Z^1$ and $Z^2$ represent nonmetal atomic groups necessary for forming a five-membered or a six-membered ring as mentioned above. Examples of the five-membered or six-membered ring may include a pyridine, imidazole, pyrrole, 2-pyrroline, pyrrolidine, piperidine, pyrazole, pyrazoline or imidazoline ring.

Examples of the cation as represented by the formula [III-b] may include a dodecylpyridinium, hexadecylpyridinium, dodecylimidazolium group. Examples of the cation as represented by the formula [III-c] may include a N-ethyl-N-hexadecylpiperidinium group, or a N-ethyl-N-dodecylpyrazolidinium group.

From the viewpoint of availability of raw materials and production cost, preferred cations in the cations represented by the formulae [III-a] to [III-e] are those represented by the formulae [III-a], [III-b], [III-d] and (III-e).

The type of cation [Cat ] has influence upon the solubility of the compounds represented by the afore-mentioned formulae [I] and [II] in an organic solvent.

In general, when a substituent bonded to a quaternary hetero atom in the cation is an alkyl group, the longer a chain the alkyl group is, the higher its solubility is. Especially, in case of tetraalkyl-substituted ammonium or phosphonium, such a tendency is remarkable. An ammonium cation having 17 or more of total carbon atoms or a phosphonium cation having 4 or more of total carbon atoms provides high solubility for the compounds represented by general formulae [I] and [II] and those represented by general formula [IV] described later. The compounds represented by the formulae [I] and [II] are preferably contained as a composition in a binder in a dispersed state, and preferably has a high compatibility with a coating composition or binder.

M in the compounds represented by formulae [I] and [II] is suitably selected in consideration of absorption wavelength and cost, and is preferably nickel, cobalt, copper, palladium and platinum in order. In case of nickel, its oxidation state is favorably trivalent rather than divalent. A complex containing divalent nickel as a center metal does not show high absorptivity of infrared rays.

The metal complex as represented by formulae [I] or [II] has a stereostructure of planar quadridentate. Although it is not definitely determined that a thio ketone group in the compound of formula [II] is symmetrical or asymmetrical with respect to the center metal, it is expediently represented by formula [II] in this specification and the claims.

The compounds represented by formulae [I] and [II] are synthesized in the following manner.

The compound of formula [I] is synthesized in the following manner; that is, a zinc complex is prepared from disodium-1,3-dithiol-2-thion-4,5-dithiolate obtained by the reaction between carbon disulfide and sodium, and then the zinc complex is reacted with benzoyl chloride to form a bisbenzoylthio compound. The bisbenzoylthio compound is decomposed by alkali, and is reacted with metal salt to precipitate a complex. The complex is in turn oxidized.

The compound of formula [II] is synthesized in the following manner; that is, disodium-1,3-dithiol-2-thion-4,5-dithiolate obtained by the reaction between carbon disulfide and sodium is isomerized to disodium-1,2-dithiol-3-thion-4,5-dithiolate by heating at about 130° C. to prepare a zinc complex. The zinc complex is reacted with benzoyl chloride to form a bisbenzoylthio compound. The bisbenzoylthio compound is decomposed by alkali, and is reacted with metal salt to precipitate a complex. The complex is in turn oxidized.

1,3-dithiol-2-thion-4,5-dithiolate anion as an intermediate of the compound of formulae [I] or [II] may also be obtained by an electrochemical reduction process as well as the above-mentioned reduction by Na.

In the following, preferred compounds of the compounds represented by formulae [I] and [II] will be exemplified. However, it should be noted that the present invention is not limited to the exemplified compounds.

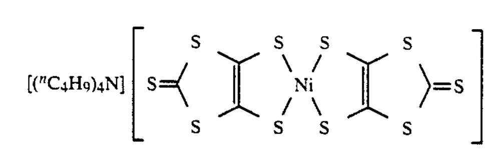
(1)

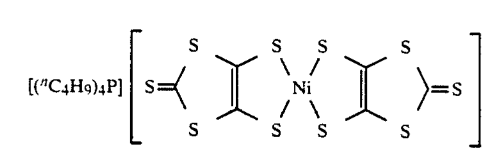
(2)

-continued
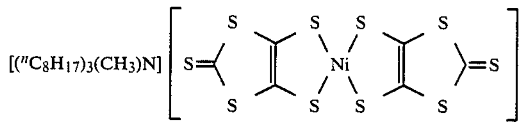
(3)
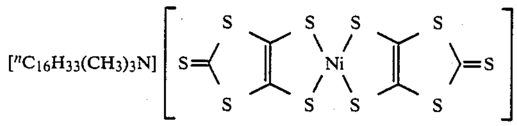
(4)
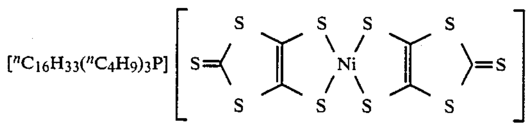
(5)
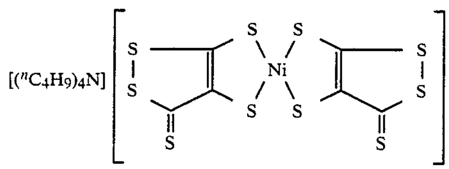
(6)
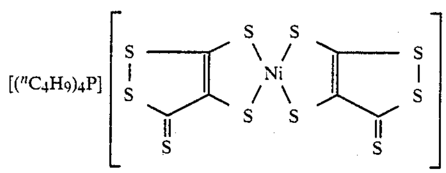
(7)
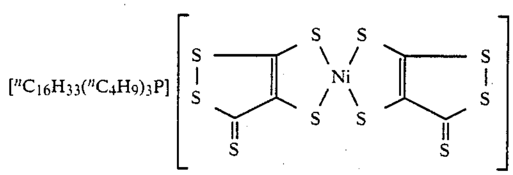
(8)
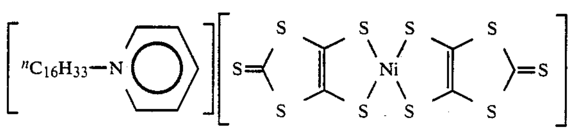
(9)
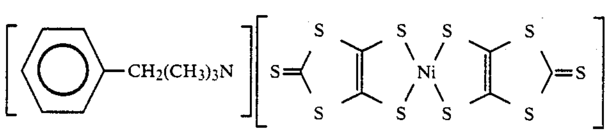
(10)
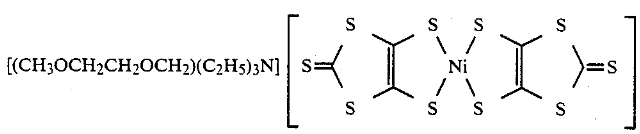
(11)
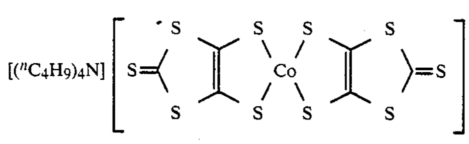
(12)

-continued
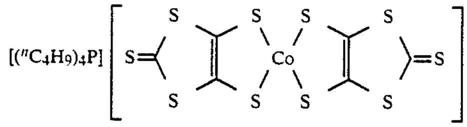
(13)
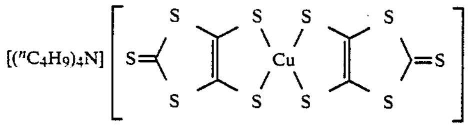
(14)
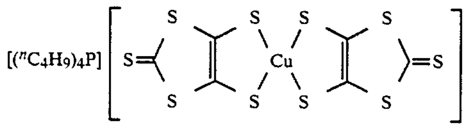
(15)
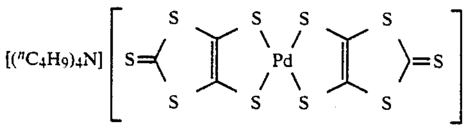
(16)
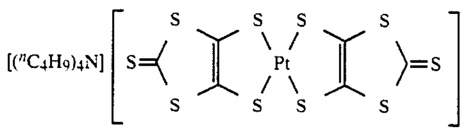
(17)
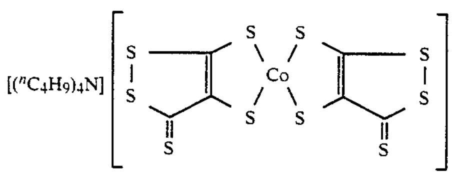
(18)
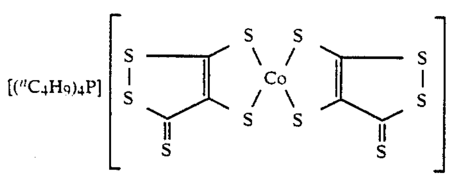
(19)
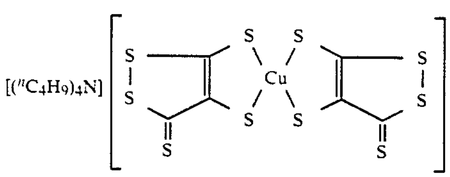
(20)
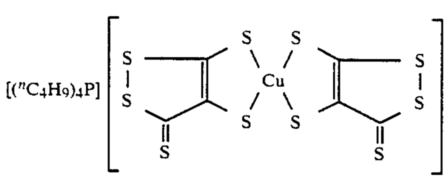
(21)
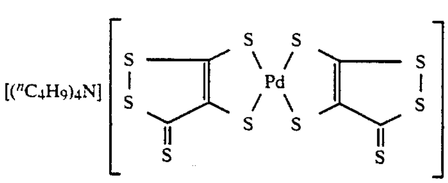
(22)

-continued

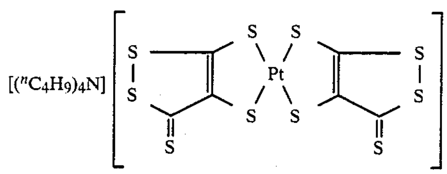

(23)

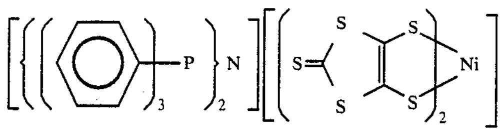

(24)

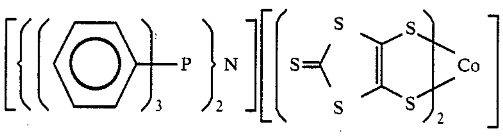

(25)

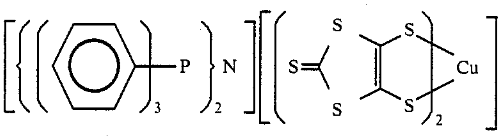

(26)

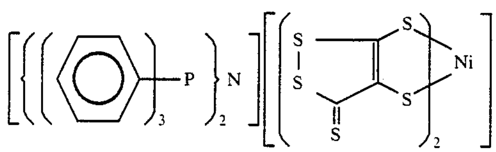

(27)

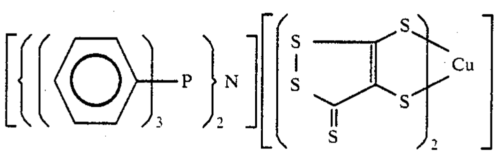

(28)

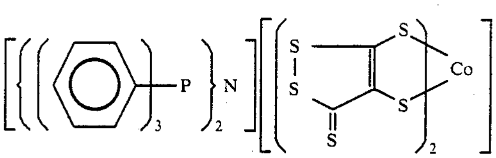

(29)

An absorption maximum ($\lambda_{max}$) and a molar absorption coefficient ($\epsilon_{max}$; $l.mol^{-1}.cm^{-1}$) of the abovementioned compounds are shown in Table 1.

TABLE 1

| Compound No. | $\lambda_{max}$(nm) | $\epsilon_{max}(\times 10^4)$ |
|---|---|---|
| (24) | 1125 | 2.51 |
| (25) | 1074 | 2.46 |
| (26) | 963 | 2.53 |
| (27) | 1138 | 2.50 |
| (28) | 1107 | 2.51 |
| (29) | 1071 | 2.50 |

Another example of the preferred infrared absorbent according to the present invention is represented by the following formula:

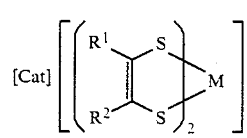

[IV]

wherein, $R^1$ and $R^2$, M and [Cat] have the same meaning as defined above.

The alkyl group as represented by $R^1$ and $R^2$ in formula [IV] is preferably an alkyl group containing 1 to 20 carbon atoms which may be a straight or a branched chain alkyl group. The alkyl group may further be substituted. Typical examples of the alkyl group may include a methyl group, ethyl group, propyl group, butyl group, hexyl group, octyl group, decyl group, dodecyl group, hexadecyl group and octadecyl group. The aryl group as represented by $R^1$ and $R^2$ is preferably an aryl group containing 6 to 16 carbon atoms. The aryl group may further be substituted. Typical examples of the aryl group may include a phenyl group, naphtyl group and pyrenyl group. The heterocyclic group as represented by $R^1$ and $R^2$ is preferably a five-membered or six-membered ring containing at least one of nitrogen, oxygen and sulphur atoms as a hetero atom in the ring. The heterocyclic group may further be substituted. Typical examples of the heterocyclic group may include a furyl group, hydrofuryl group, thienyl group, pyrrolyl group, pyrrolidyl group, pyridyl group, imidazolyl group, pyrazolyl group, quinolyl group, indolyl group, oxazolyl group and thiazolyl group.

Examples of the substituents introduced into the above-mentioned alkyl group, aryl group and heterocyclic group as represented by $R^1$ and $R^2$ may include a halogen atom (e.g., a fluorine, chlorine, bromine or iodine atom), a cyano group, a hydroxyl group, a straight or a branched chain alkyl group (e.g., a methyl, ethyl, propyl, butyl, hexyl, octyl, decyl, dodecyl, tetradecyl, hexadecyl, heptadecyl, octadecyl or methoxyethoxyethyl group), an aryl group (e.g., a phenyl, tolyl, naphtyl, chlorophenyl, methoxyphenyl or acetylphenyl group), an alkoxy group (e.g., a methoxy, ethoxy, butoxy, propoxy or methoxyethoxy group), an aryloxy group (e.g., a phenoxy, tolyoxy, naphtoxy or methoxyphenoxy group), an alkoxycarbonyl group (e.g., a methoxycarbonyl, butoxycarbonyl or phenoxycarbonyl group), an aryloxycarbonyl group (e.g., a phenoxycarbonyl, tolyoxycarbonyl or methoxyphenoxy carbonyl group), an acyl group (e.g., a formyl, acetyl, valeryl, stearoyl, benzoyl, toluoyl, naphtoyl or p-methoxybenzoyl group), an acyloxy group (e.g., an acetoxy or acyloxy group), an acylamino group (e.g., an acetamido, benzamido or methoxyacetamido group), an anilino group (e.g., a phenylamino, N-methylanilino, N-phenylanilino or N-acetylanilino group), an alkylamino group (e.g., a n-butylamino, N,N-diethylamino, 4-methoxy-n-butylamino group), a carbamoyl group (e.g., n-butylcarbamoyl, N,N-diethylcarbamoyl group), a sulfamoyl group (e.g., a n-butylsulfamoyl, N,N-diethylsulfamoyl, n-dodecylsulfamoyl or N-(4-methoxy-n-butylsulfamoyl group), a sulfonylamino group (e.g., a methylsulfonylamino, phenylsulfonylamino or methoxymethylsulfonylamino group), or a sulfonyl group (e.g., a mesyl, tosyl or methoxymethanesulfonyl group).

The relation between the type of the cation in the compound represented by formula [IV] and the solubility of the compound to an organic solvent is similar to that mentioned for the compounds represented by the formulae [I] and [II].

The compound represented by formula [IV] is also preferably contained as a composition in a binder in a dispersed state, and preferably has a high compatibility with a coating composition or the binder.

In the compound represented by the formula [IV], a formal oxidation state of M is preferably trivalent. A complex containing a divalent center metal does not show a strong absorptivity of infrared rays. In the description the complex containing a divalent center metal means, for example, a complex having the following structure:

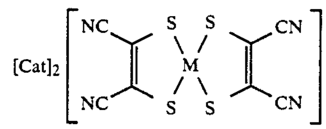

wherein, [Cat] represents a monovalent cation.

In formula [IV], M is effective for minutely adjusting the wavelength of absorption maximum and the molar absorption coefficient. The compound containing nickel as M is preferable because a metal salt as raw material is inexpensive. In the case that M is a palladium or platinum, the wavelength of absorption maximum is in the range of 850–1000 nm, and a molar absorption coefficient is in most compounds greater than that in the case of nickel by about 10%.

The compound represented by formula [IV] is synthesized in the following manner; that is, in the case of $R^1=R^2=H$ for example, a reaction product, cis-1,2-bis(benzylthio) ethylene prepared from cis-dichloroethylene, benzyl chloride and thiourea is decomposed by alkali to give a disodium salt of cis-dimercaptoethylene. Then, a metal salt is added to the disodium salt, and subsequently a quaternary salt is added thereto.

Further, in case of $R^1=R^2=CN$, the compound is synthesized by the following manner; that is, a sodium cyanide, carbon disulfide and N,N-dimethylformamide are first reacted with each other to prepare sodium cyanodithioformate. The sodium cyanodithioformate is thermally decomposed to give sodium-cis-1,2-dicyano-1,2ethylene dithiolate. The dithiolate is in turn reacted with a metal salt (e.g., a nickel salt), and then is reacted with a salt of an appropriate cation to precipitate a complex. Then, the complex is oxidized.

The other compound may be synthesized by the following manner; that is, the corresponding derivative of acyloin or benzoin is first reacted with phosphorus pentasulfide to prepare dithiophosphate of dithiol, which is in turn reacted with a metal salt to isolate a complex having a formal oxidation number of quadrivalency. Then, the complex is dissolved in dimethyl sulfoxide in an atmosphere of argon, and para-pehnylenediamine is added to the solution to conduct the reduction. Then, a quaternary salt is added to the solution to precipitate the complex.

In the following, the preferred compounds of the compounds represented by the formula [IV] will be exemplified. However, it should be noted that the present invention is not limited to the exemplified compounds.

TABLE 2-1

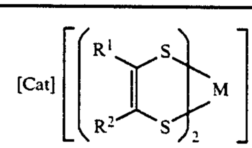

[IV]

| Compound No. | [Cat] | $R^1$ | $R^2$ | M |
|---|---|---|---|---|
| 30 | a | H | $CH_3$ | Ni |
| 31 | b | " | " | " |
| 32 | c | " | " | " |
| 33 | d | " | " | " |

TABLE 2-1-continued
[IV]
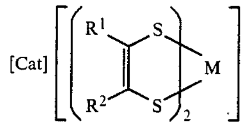
| Compound No. | [Cat] | $R^1$ | $R^2$ | M |
|---|---|---|---|---|
| 34 | e | " | " | " |
| 35 | f | " | " | " |
| 36 | a | " | $^tC_4H_9$ | " |
| 37 | a | $CH_3$ | $CH_3$ | " |
| 38 | b | " | " | " |
| 39 | c | " | " | " |
| 40 | d | " | " | " |
| 41 | e | " | " | " |
| 42 | f | " | " | " |
| 43 | b | " | $C_2H_5$ | " |
| 44 | c | $CH_3$ | " | " |
| 45 | d | $^nC_4H_9$ | $^nC_4H_9$ | " |
| 46 | a | H | 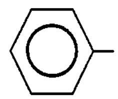 | " |
| 47 | b | " | " | " |
| 48 | c | " | " | " |
| 49 | d | " | " | " |
| 50 | e | " | " | " |
| 51 | f | " | " | " |
| 52 | a | H | 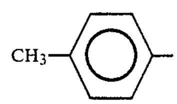 | " |
| 53 | b | " | 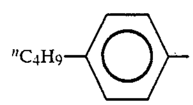 | " |
| 54 | c | " | $^nC_8H_{17}$ | " |
| 55 | d | H | $^nC_{10}H_{21}$ | " |
| 56 | a | H | 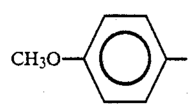 | " |
| 57 | b | " | " | " |
| 58 | c | " | " | " |
| 59 | d | " | " | " |
| 60 | e | " | " | " |
| 61 | f | " | " | " |
| 62 | e | " | 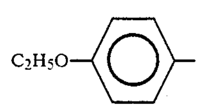 | " |
| 63 | f | " | 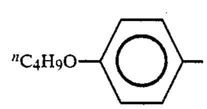 | " |
| 64 | a | " | 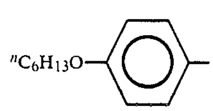 | " |

TABLE 2-1-continued
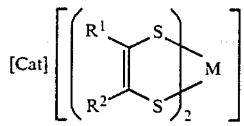
[IV]
| Compound No. | [Cat] | $R^1$ | $R^2$ | M |
|---|---|---|---|---|
| 65 | b | " | 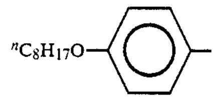 | " |
| 66 | c | " | 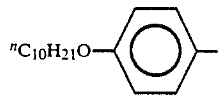 | " |
| 67 | d | " | 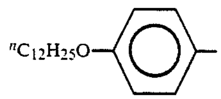 | " |
| 68 | e | " | 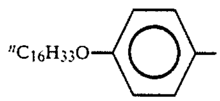 | " |
| 69 | f | " | 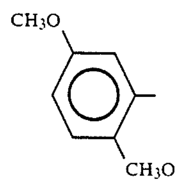 | " |
| 70 | a | H | 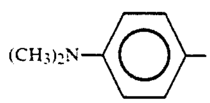 | " |
| 71 | a | $CH_3$ | 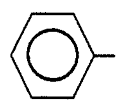 | " |
| 72 | a | $CH_3$ | 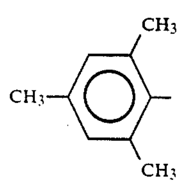 | " |
| 73 | a | 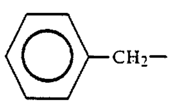 | 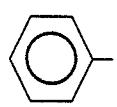 | " |
| 74 | a | 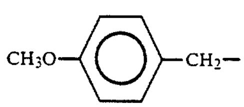 | 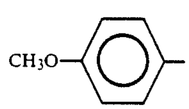 | " |
| 75 | a | $CH_3O-CH_2CH_2-$ | 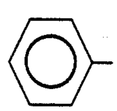 | " |
| 76 | b | $^nC_4H_9$ | " | " |

TABLE 2-1-continued
[IV]
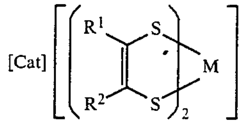
| Compound No. | [Cat] | $R^1$ | $R^2$ | M |
|---|---|---|---|---|
| 77 | a | 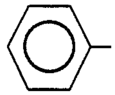 | " | " |
| 78 | b | " | " | " |
| 79 | c | " | " | " |
| 80 | e | " | " | " |
| 81 | a | Cl— 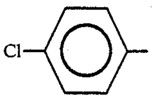 | Cl— 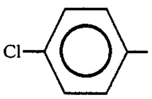 | " |
| 82 | c | $CH_3$— 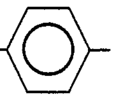 | $CH_3$— 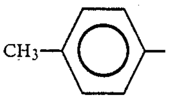 | " |
| 83 | a | $CH_3O$— 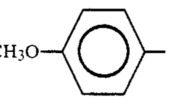 | $CH_3O$— 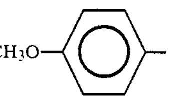 | " |
| 84 | d | " | " | " |
| 85 | a | $C_2H_5O$— 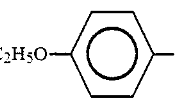 | $C_2H_5O$— 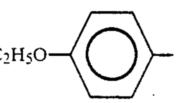 | " |
| 86 | e | $^nC_4H_9O$— 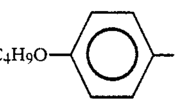 | $^nC_4H_9O$— 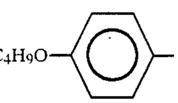 | " |
| 87 | a | $^nC_6H_{13}O$— 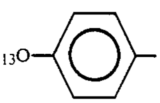 | $^nC_6H_{13}O$— 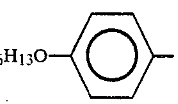 | " |
| 88 | a | $^nC_8H_{17}O$— 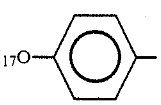 | $^nC_8H_{17}O$— 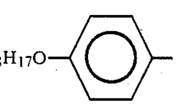 | " |
| 89 | a | $^nC_{10}H_{21}O$— 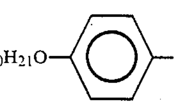 | $^nC_{10}H_{21}O$— 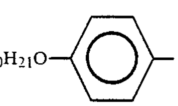 | " |
| 90 | a | $^nC_{12}H_{25}O$— 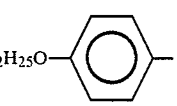 | $^nC_{12}H_{25}O$— 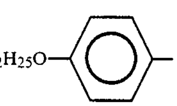 | " |
| 91 | a | $^nC_{16}H_{33}O$— 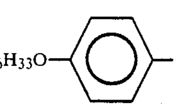 | $^nC_{16}H_{33}O$— 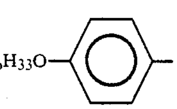 | " |

TABLE 2-1-continued
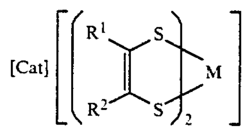
[IV]
| Compound No. | [Cat] | R¹ | R² | M |
| --- | --- | --- | --- | --- |
| 92 | c | 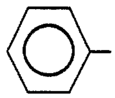 | 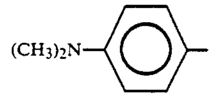  | " |
| 93 | e | " | 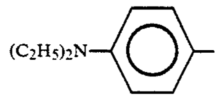  | " |
| 94 | e | 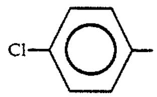  | 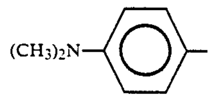  | " |
| 95 | a | 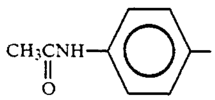  | 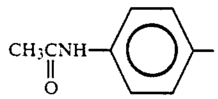  | " |
| 96 | a | 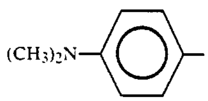  | 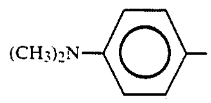  | " |
| 97 | a | 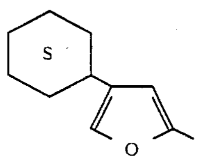  | 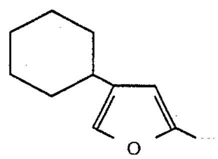  | " |
| 98 | a | 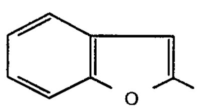  | 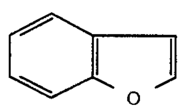  | " |
| 99 | a | 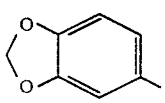  | 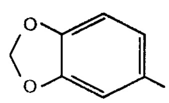  | " |
| 100 | a | 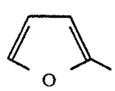  | 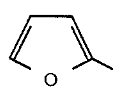  | " |
| 101 | a | 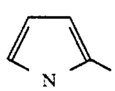  | 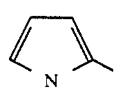  | " |
| 102 | a | 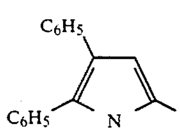  | 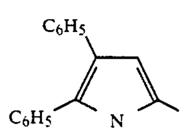  | " |
| 103 | a | 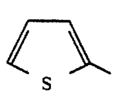  | 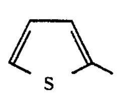  | " |

TABLE 2-1-continued

[IV]

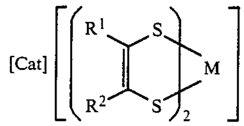

| Compound No. | [Cat] | $R^1$ | $R^2$ | M |
|---|---|---|---|---|
| 104 | a | 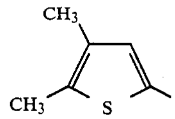 | 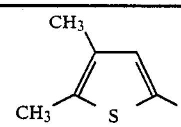 | " |
| 105 | a | 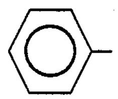 | 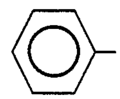 | Pd |
| 106 | b | " | " | Pt |

(Note: Symbols (") in the above Table means ditto.)
(Note: Symbols (a)-(f) in the column of [Cat] represent the following cations.)
a: $(^nC_4H_9)_4N^{\oplus}$
b: $^nC_{16}H_{33}(CH_3)_3N^{\oplus}$
c: $(^nC_4H_9)_4P^{\oplus}$
d: $^nC_{16}H_{33}(^nC_4H_9)_3P^{\oplus}$
e: $\{(C_6H_5)_3P\}_2N^{\oplus}$
f: 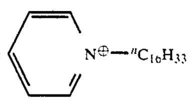

TABLE 2-2

[IV-a]

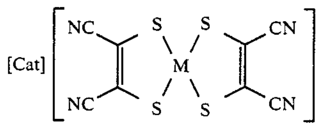

| Compound No. | Cat | M |
|---|---|---|
| 107 | $(^nC_4H_9)_4N$ | Ni |
| 108 | $(^nC_8H_{17})_3(CH_3)N$ | " |
| 109 | $^nC_8H_{17}(CH_3)_3N$ | " |
| 110 | $^nC_{10}H_{21}(CH_3)_3N$ | " |
| 111 | $^nC_{14}H_{29}(CH_3)_3N$ | " |
| 112 | $^nC_{16}H_{33}(CH_3)_3N$ | " |
| 113 | $^nC_{18}H_{37}(CH_3)_3N$ | " |
| 114 | 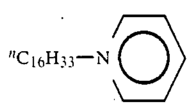 | " |
| 115 | 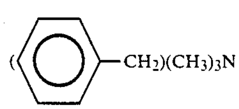 | " |
| 116 | $(CH_3OCH_2CH_2OCH_2)(C_2H_5)_3N$ | " |
| 117 | $(^nC_4H_9)_4P$ | " |
| 118 | $^nC_{16}H_{33}(^nC_4H_9)_3P$ | " |
| 119 | 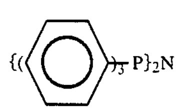 | " |
| 120 | $(^nC_4H_9)_4N$ | Co |
| 121 | $(^nC_4H_9)_4P$ | " |

TABLE 2-2-continued

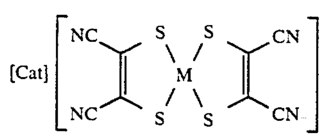

[IV-a]

| Compound No. | Cat | M |
|---|---|---|
| 122 | 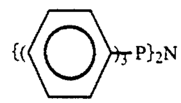 | " |
| 123 | $(^nC_4H_9)_4N$ | Pd |
| 124 | $(^nC_4H_9)_4P$ | " |
| 125 | $(^nC_4H_9)_4N$ | Pt |
| 126 | $(^nC_4H_9)_4N$ | Cu |
| 127 | $(^nC_4H_9)_4N$ | " |
| 128 | 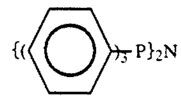 | " |

(Note: Symbols (") in the above Table means ditto.)

An absorption maximum ($\lambda_{max}$; nm) and a molar absorption coefficient ($\epsilon_{max}$; l $mol^{-1}cm^{-1}$) of the typical compounds in the above Table are shown in Table 3.

TABLE 3

| Compound No. | $\lambda_{max}$ | $\epsilon_{max} \times 10^4$ |
|---|---|---|
| (107) | 860 | 0.80 |
| (118) | 862 | 0.80 |
| (123) | 1111 | 1.38 |
| (125) | 855 | 1.17 |
| (120) | 776 | 0.37 |

In the complexes represented by the above-mentioned formulae, the complexes containing nickel, palladium and platinum as a center metal have a high molar absorption coefficient. The wavelength of absorption maximum is the longest in case of palladium, while it is relatively short (700–800 nm) in case of cobalt. Differences in the type of the cation do not show great influence upon the wavelength of absorption maximum.

A cobalt complex has a wavelength of absorption maximum approximate to an emission wavelength (780 nm) of a gallium-arsenic semiconductor laser and it is preferably used in combination with such laser.

Still another example of the preferred infrared rays absorbent according to the present invention is represented by the following formulae [V], [VI] and [VII]:

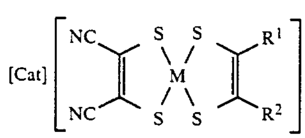

[V]

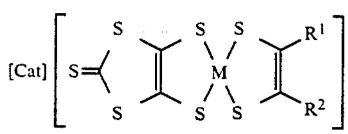

[VI]

-continued

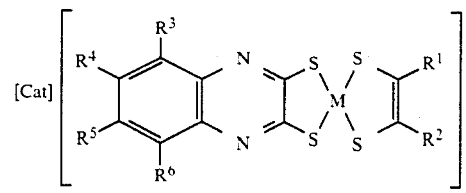

[VII]

wherein, $R^1$ to $R^6$, M and [Cat] have the same meaning as defined above.

In the compound represented by formulae [V]–[VII], preferred examples of $R^1$ to $R^6$, M and [Cat] and the relation between kind of [Cat] and solubility of the compounds, etc. are similar to those as mentioned for the compounds represented by formulae [I], [II] or [IV].

The compounds of formulae [V]–[VII] can be obtained by mixing a divalent complex with a quadrivalent complex in an equimole (such a valency is a formal oxidation number of the center metal) in an organic solvent (e.g., acetone), and refluxing the mixture.

In the following, the preferred compounds of the compounds represented by formulae [V]–[VII] will be exemplified. However, it should be noted that the present invention is not limited to the exemplified compounds.

In Tables 4–6, symbols (a)–(f) in [Cat ] represent the following cations.

a: $[(^nC_4H_9)_4N]^+$
b: $[(^nC_4H_9)_4P]^+$
c: $[^nC_{16}H_{33}(CH_3)_3N]^+$
d: $[^nC_{16}H_{33}(^nC_4H_9)_3P]^+$
e: 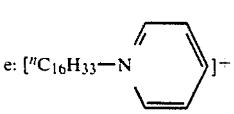

-continued

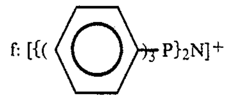

TABLE 4

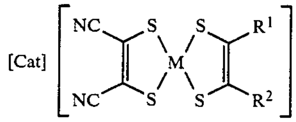

| Compound No. | Cat | R[1] | R[2] | M |
|---|---|---|---|---|
| 129 | a | $CH_3$ | $CH_3$ | Ni |
| 130 | b | " | " | " |
| 131 | c | " | " | " |
| 132 | d | " | " | " |
| 133 | e | " | " | " |
| 134 | f | " | " | " |
| 135 | a | H | 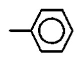 | " |
| 136 | b | " | " | " |
| 137 | c | " | " | " |
| 138 | d | " | " | " |
| 139 | e | " | " | " |
| 140 | f | " | " | " |
| 141 | a | $CH_3$ | " | " |
| 142 | b | " | " | " |
| 143 | c | " | " | " |
| 144 | d | " | " | " |
| 145 | e | " | " | " |
| 146 | f | " | " | " |
| 147 | a | 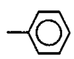 | " | " |
| 148 | b | " | " | " |
| 149 | c | " | " | " |
| 150 | d | " | " | " |
| 151 | e | " | " | " |
| 152 | f | " | " | " |
| 153 | a | 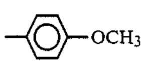 | 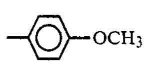 | " |
| 154 | b | " | " | " |
| 155 | c | " | " | " |
| 156 | d | " | " | " |
| 157 | e | " | " | " |
| 158 | f | " | " | " |
| 159 | a | H | " | " |
| 160 | b | " | " | " |
| 161 | c | " | " | " |
| 162 | d | " | " | " |
| 163 | e | " | " | " |
| 164 | f | " | " | " |
| 165 | a | " | 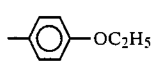 | " |
| 166 | b | " | 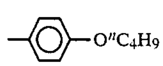 | " |
| 167 | d | " | 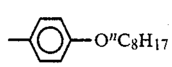 | " |
| 168 | a | " | 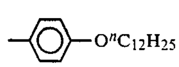 | " |

TABLE 4-continued

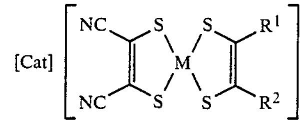

| Compound No. | Cat | R[1] | R[2] | M |
|---|---|---|---|---|
| 169 | c | 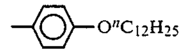 | " | " |
| 170 | a | H | 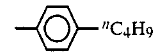 | " |
| 171 | d | " | 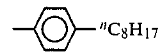 | " |
| 172 | e | " | 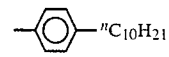 | " |
| 173 | a | " | 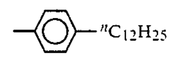 | " |
| 174 | b | " | 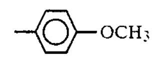 | Pd |
| 175 | b | " | " | Pt |

TABLE 5

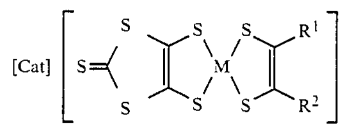

| Compound No. | Cat | R[1] | R[2] | M |
|---|---|---|---|---|
| 176 | a | $CH_3$ | $CH_3$ | Ni |
| 177 | b | " | " | " |
| 178 | c | " | " | " |
| 179 | d | " | " | " |
| 180 | e | " | " | " |
| 181 | f | " | " | " |
| 182 | a | H | 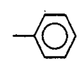 | " |
| 183 | b | " | " | " |
| 184 | c | " | " | " |
| 185 | d | " | " | " |
| 186 | e | " | " | " |
| 187 | f | " | " | " |
| 188 | a | $CH_3$ | 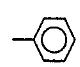 | " |
| 189 | b | " | " | " |
| 190 | c | " | " | " |
| 191 | d | " | " | " |
| 192 | e | " | " | " |
| 193 | f | " | " | " |
| 194 | a | 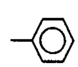 | " | " |
| 195 | b | " | " | " |
| 196 | c | " | " | " |

TABLE 5-continued

[Cat] 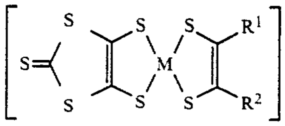

| Compound No. | Cat | R¹ | R² | M |
|---|---|---|---|---|
| 197 | d | " | " | " |
| 198 | e | " | " | " |
| 199 | f | " | " | " |
| 200 | a | 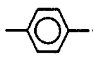$OCH_3$ | 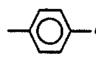$OCH_3$ | " |
| 201 | b | " | " | " |
| 202 | c | " | " | " |
| 203 | d | " | " | " |
| 204 | e | " | " | " |
| 205 | f | " | " | " |
| 206 | a | H | 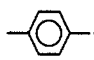$OCH_3$ | " |
| 207 | b | " | " | " |
| 208 | c | " | " | " |
| 209 | d | " | " | " |
| 210 | e | " | " | " |
| 211 | f | " | " | " |
| 212 | a | " | 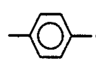$OC_2H_5$ | " |
| 213 | a | " | 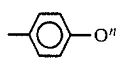$O^nC_4H_9$ | " |
| 214 | c | " | 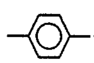$O^nC_8H_{17}$ | " |
| 215 | b | " | 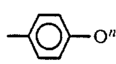$O^nC_{12}H_{25}$ | " |
| 216 | e | 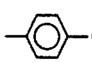$O^nC_{12}H_{25}$ | 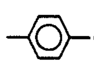$O^nC_{12}H_{25}$ | " |
| 217 | a | H | 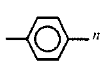$^nC_4H_9$ | " |
| 218 | d | " | 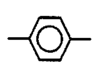$^nC_8H_{17}$ | " |
| 219 | a | " | 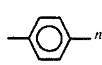$^nC_{10}H_{21}$ | " |
| 220 | a | " | 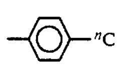$^nC_{12}H_{25}$ | " |
| 221 | b | " | 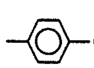$OCH_3$ | Pd |
| 222 | b | " | " | Pt |

TABLE 6-1

[Cat.] 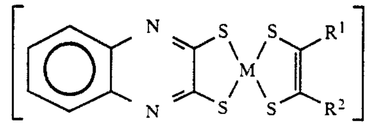

| Compound No. | Cat | R¹ | R² | M |
|---|---|---|---|---|
| 223 | a | $CH_3$ | $CH_3$ | Ni |
| 224 | b | " | " | " |
| 225 | c | " | " | " |
| 226 | d | " | " | " |
| 227 | e | " | " | " |
| 228 | f | " | " | " |
| 229 | a | H | 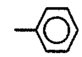 | " |
| 230 | b | " | " | " |
| 231 | c | " | " | " |
| 232 | d | " | " | " |
| 233 | e | " | " | " |
| 234 | f | H | 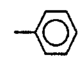 | Ni |
| 235 | a | $CH_3$ | " | " |
| 236 | b | " | " | " |
| 237 | c | " | " | " |
| 238 | d | " | " | " |
| 239 | e | " | " | " |
| 240 | f | " | " | " |
| 241 | a | 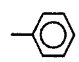 | " | " |
| 242 | b | " | " | " |
| 243 | c | " | " | " |
| 244 | d | " | " | " |
| 245 | e | " | " | " |
| 246 | f | " | " | " |
| 247 | a | 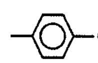$OCH_3$ | 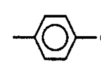$OCH_3$ | " |
| 248 | b | " | " | " |
| 249 | c | " | " | " |
| 250 | d | " | " | " |
| 251 | e | " | " | " |
| 252 | f | 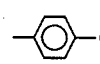$OCH_3$ | 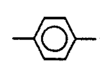$OCH_3$ | Ni |
| 253 | a | H | " | " |
| 254 | b | " | " | " |
| 255 | c | " | " | " |
| 256 | d | " | " | " |
| 257 | e | " | " | " |
| 258 | f | " | " | " |
| 259 | a | " | 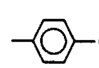$OC_2H_5$ | " |
| 260 | b | " | " | " |
| 261 | c | " | " | " |
| 262 | d | " | " | " |
| 263 | e | " | " | " |
| 264 | f | " | " | " |
| 265 | a | " | 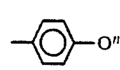$O^nC_4H_9$ | " |

TABLE 6-1-continued

[Cat.] 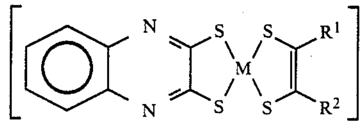

| Compound No. | Cat | $R^1$ | $R^2$ | M |
|---|---|---|---|---|
| 266 | b | " | 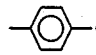O$^n$C$_8$H$_{17}$ | " |
| 267 | c | " | 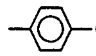O$^n$C$_{12}$H$_{25}$ | " |
| 268 | a | 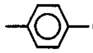O$^n$C$_{12}$H$_{25}$ | 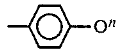O$^n$C$_{12}$H$_{25}$ | " |
| 269 | a | H | 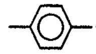$^n$C$_4$H$_9$ | " |

TABLE 6-1-continued

[Cat.] 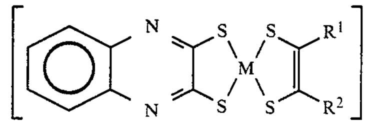

| Compound No. | Cat | $R^1$ | $R^2$ | M |
|---|---|---|---|---|
| 270 | d | H | 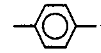$^n$C$_8$H$_{17}$ | Ni |
| 271 | c | " | 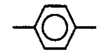$^n$C$_{10}$H$_{21}$ | " |
| 272 | a | " | 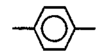$^n$C$_{12}$H$_{25}$ | " |
| 273 | b | " | 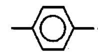OCH$_3$ | Pd |
| 274 | b | " | " | Pt |

(Note: Symbols (") in the above Table means ditto.)

TABLE 6-2

[Cat] 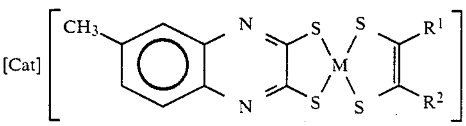

| Compound No. | Cat | $R^1$ | $R^2$ | M |
|---|---|---|---|---|
| 275 | a | $CH_3$ | $CH_3$ | Ni |
| 276 | b | " | " | " |
| 277 | c | " | " | " |
| 278 | d | " | " | " |
| 279 | e | " | " | " |
| 280 | f | " | " | " |
| 281 | a | H | 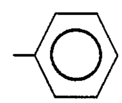 | " |
| 282 | b | " | " | " |
| 283 | c | " | " | " |
| 284 | d | " | " | " |
| 285 | e | " | " | " |
| 286 | f | H | 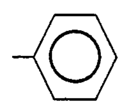 | Ni |
| 287 | a | $CH_3$ | " | " |
| 288 | b | " | " | " |
| 289 | c | " | " | " |
| 290 | d | " | " | " |
| 291 | e | " | " | " |
| 292 | f | " | " | " |
| 293 | a | 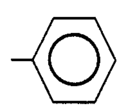 | " | " |
| 294 | b | " | " | " |
| 295 | c | " | " | " |
| 296 | d | " | " | " |
| 297 | e | " | " | " |
| 298 | f | " | " | " |

TABLE 6-2-continued
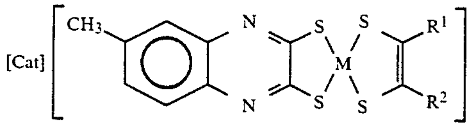
| Compound No. | Cat | R[1] | R[2] | M |
|---|---|---|---|---|
| 299 | a | 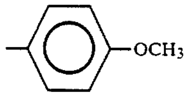 | 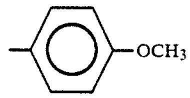 | " |
| 300 | b | " | " | " |
| 301 | c | " | " | " |
| 302 | d | " | " | " |
| 303 | e | " | " | " |
| 304 | f | 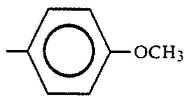 | 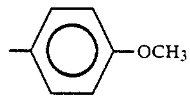 | Ni |
| 305 | a | H | " | " |
| 306 | b | " | " | " |
| 307 | c | " | " | " |
| 308 | d | " | " | " |
| 309 | e | " | " | " |
| 310 | f | " | " | " |
| 311 | a | " | 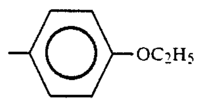 | " |
| 312 | c | " | 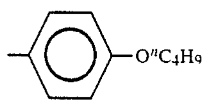 | |
| 313 | a | " | 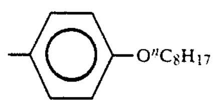 | " |
| 314 | d | " | 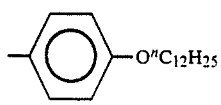 | " |
| 315 | a | 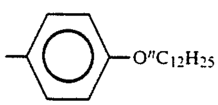 | 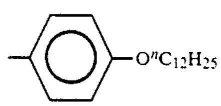 | " |
| 316 | b | H | 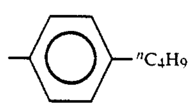 | " |
| 317 | c | " | 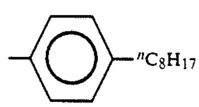 | " |
| 318 | e | " | 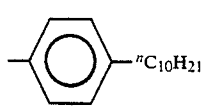 | " |

TABLE 6-2-continued
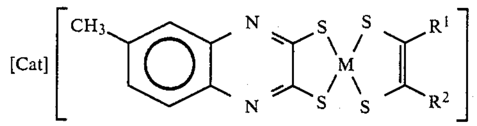
| Compound No. | Cat | $R^1$ | $R^2$ | M |
|---|---|---|---|---|
| 319 | a | " | 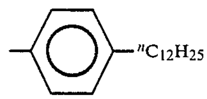 | " |
| 320 | b | " | 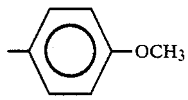 | Pd |
| 321 | b | " | " | Pt |
(Note: Symbols (") in the above Table means ditto.)
TABLE 6-3
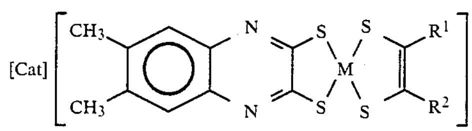
| Compound No. | Cat | $R^1$ | $R^2$ | M |
|---|---|---|---|---|
| 322 | a | $CH_3$ | $CH_3$ | Ni |
| 323 | b | " | " | " |
| 324 | c | " | " | " |
| 325 | d | " | " | " |
| 326 | e | " | " | " |
| 327 | f | " | " | " |
| 328 | a | H | 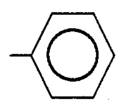 | " |
| 329 | b | " | " | " |
| 330 | c | " | " | " |
| 331 | d | " | " | " |
| 332 | e | " | " | " |
| 333 | f | H | 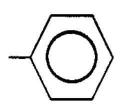 | Ni |
| 334 | a | $CH_3$ | " | " |
| 335 | a | 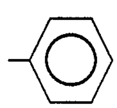 | " | " |
| 336 | b | " | " | " |
| 337 | c | " | " | " |
| 338 | d | " | " | " |
| 339 | e | " | " | " |
| 340 | f | " | " | " |
| 341 | a | 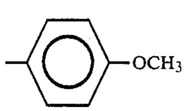 | 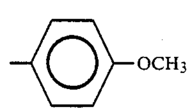 | " |
| 342 | a | H | " | " |
| 343 | b | " | " | " |
| 344 | c | " | " | " |

TABLE 6-3-continued

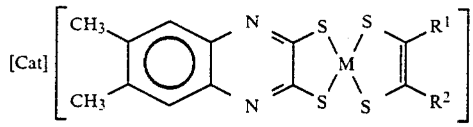

| Compound No. | Cat | $R^1$ | $R^2$ | M |
|---|---|---|---|---|
| 345 | d | " | " | " |
| 346 | e | " | " | " |
| 347 | f | " | " | " |
| 348 | b | " | 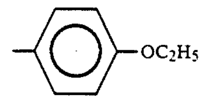 | " |
| 349 | d | " | 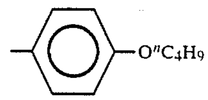 | " |
| 350 | a | " | 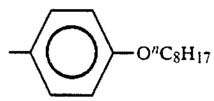 | " |
| 351 | a | H | 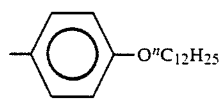 | Ni |
| 352 | c | 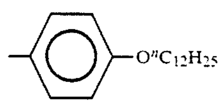 | 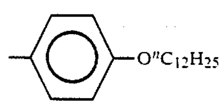 | " |
| 353 | b | H | 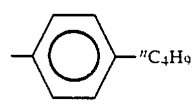 | " |
| 354 | a | " | 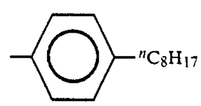 | " |
| 355 | b | " | 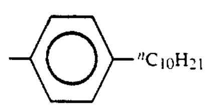 | " |
| 356 | e | " | 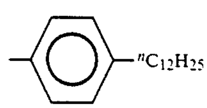 | " |
| 357 | b | " | 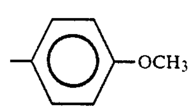 | Pd |
| 358 | b | " | " | Pt |

(Note: Symbols (") in the above Table means ditto.)

In the following, there will be described the preparation of the infrared rays absorbing material of the invention.

The infrared absorbent of the present invention may be used by allowing it to be contained in a suitable binder or be to coated on a suitable support. The binder may be any organic and inorganic material capable of exhibiting an infrared absorbing property, which materials may be high polymer materials such as plastics or inorganic materials such as glass, for example.

The binder is preferably capable of forming a film which is superior in transparency and mechanical property. Examples of such a film forming binder may include polyesters such as polyethylene terephthalate, cellulose esters such as cellulose acetate, cellulose triacetate and cellulose acetate butylate, polyolefins such as polypropylene, polyvinyl compounds such as polyvinyl chloride, polyvinylidene chloride, vinyl chloride-vinyl acetate copolymer, and polystyrene, acrylic addition polymers such as polymethyl methacrylate, polycarbonates such as polycarbonic acid ester, phenol resin, urethane resin or gelatin as a known hydrophilic binder.

As one of methods of forming a film by adding the infrared absorbent to the above-mentioned plastic materials or incorporating the same within the plastic materials, the infrared absorbent is incorporated in the plastics before preparing the film. Namely, the infrared absorbent is mixed with a polymer powder or pellet together with various additives, and is molten to extrude the mixture by a T-die process or a tubular film process, or the mixture is made into a film by calendering thereby to give a film containing the absorbent which is uniformly dispersed. In the case of preparing the film from a polymer solution by a casting method, the infrared absorbent may be contained in the polymer solution.

In a second method, an infrared absorbing layer may be formed by applying a polymer solution or dispersion containing the infrared absorbent onto a surface of various plastic films or glass plates as prepared by a suitable method. A binder polymer used for a coating liquid is selected from materials having a good solubility of the infrared absorbent and a superior adhesiveness to the plastic film or glass plate as a support. For example, a suitable one of these materials may be polymethyl methacrylate, cellulose acetate butylate, or polycarbonate. Optionally, a suitable undercoat may be preliminarily formed on the support film for purpose of improving adhesiveness.

In a third method, a filter may be formed in a frame of a light window of an element to be isolated from infrared rays with use of a polymer prepared by mixing the infrared absorbent with a polymerizable monomer and adding a suitable polymerization initiator to polymerize the mixture with heat or light. In this method, the element may be entirely enclosed by plastics as prepared from a ethylene unsaturated polymerizable monomer or an addition polymerizable composition such as epoxy resin.

In a fourth method, the infrared absorbent may be deposited by evaporation on a suitable support. In this method a suitable film forming binder layer as a protective layer may be formed on the deposited layer.

A method of utilizing the near-infrared absorbent of the present invention for a color solid image pick-up element is as follows:

(1) A plurality of striped or mosaic colored separation filter layers having predetermined spectral characteristics are formed, and then the near-infrared absorbent is incorporated in a surface protective layer to be formed on the filter layers, or the absorbent is deposited on the surface protective layer.

(2) The near-infrared absorbent of the present invention in combination with a visible light absorbing dyestuff may be incorporated in the color separation filter layers.

(3) The near-infrared absorbent may be incorporated in a transparent intermediate layer or a surface smooth layer provided in a multi-layer color separation filter.

An optical filter obtained by combining the infrared absorbent of the present invention with a suitable binder is especially effective when it is used in combination with color separation filters as described in Japanese patent application (OPI) Nos. 58107/82, 9317/84 and 30509/84.

In preparing an infrared absorbing material with use of the infrared absorbent of the present invention, two or more of the infrared absorbent may be used in combination. Further, a known near-infrared absorbent of organic or metal complex substance may be used in combination. Particularly, when an absorbent having an absorption maximum different from that of the absorbent of the invention is used in combination, a range of absorption wavelength may be widened.

It is effective to add an ultraviolet absorbent to the infrared absorbent in the infrared absorbing material for purpose of improving light fastness. Examples of the ultraviolet absorbent may include substituted or unsubstituted benzoates such as resorsin monobenzoate and methyl salicylate, cinnamates such as 2-oxy-3-methoxy cinnamate, benzophenones such as 2,4-dioxy-benzophenone, $\alpha,\beta$-unsaturated ketones such as 2,4-dibenzal acetone, coumarins such as 5,7-dioxy-coumarin, carbostyrils such as 1,4-dimethyl-7-oxycarbostyril, or azoles such as 2-phenyl benzoimidazole and 2-(2-hydroxyphenyl) benzotriazole.

In the case of a film prepared by a coating method in combination with the infrared absorbent of the invention and a suitable binder, a thin plastic film may be attached or coated on a surface of the coating layer for purposes of protection or providing anti-stick quality. For example, a laminated film may be obtained by laminating a polyvinyl chloride film having a thickness of 0.05 mm on the coating layer and heat-bonding the whole laminate at 120°–140 ° C.

In preparing the optical filter material from the infrared absorbent of the present invention, 0.1–50 parts by weight, preferably 0.5–10 parts by weight of the infrared absorbent is contained in 100 parts by weight of the binder. An optical filter is obtained by working and treating the optical filter material so as to have a sufficient degree of transmittance in a wavelength range where infrared rays are to be cut-off. Accordingly, it is necessary to adjust a content of the compounds with respect to the binder and a thickness of the filter, so as to obtain a transmittance of 10% or less, preferably 2.0% or less, and more preferably 0.1% or less in the wavelength range of 900 nm or more at the trough of a transmittance curve. Although a practical thickness of the filter is in the range of 0.002 mm to 0.5 mm, it is possible to employ any filters having a thickness out of the above range according to the applications.

According to the present invention, since the infrared absorbent has a high solubility in an organic solvent, it is possible to obtain an infrared absorbing material containing the infrared absorbent compatibly dispersed in the binder.

Further, it is possible to obtain an infrared absorbing material which has a high cut-off ability against near-infrared rays per unit thickness, a high transmittance of visible light and a good fastness to heat and light. Accordingly, use of the infrared absorbent of the present invention provides a greatly thin film having a good efficiency of infrared absorption, which film is suitable for a SPD filter.

Furthermore, since a solubility of the infrared absorbing material using the infrared absorbent of the present invention in a solvent may be adjusted by suitably selecting and combining cations relative to a metal complex ion in the infrared absorbent, it is advantageously possible to widely adopt various binders.

According to the present invention, it is possible to obtain an infrared absorbing material having an absorption maximum wavelength of about 900 nm or more.

The infrared absorbent of the present invention can be applied to various uses including the afore-mentioned applications, that is, for a safelight filter for infrared sensitive materials, control of growth of plants, cut-off of heat radiation, cut off filter of infrared rays harmful to tissues of human eyes, cut off filter of infrared rays for semiconductor light receiving elements or color solid image pick-up elements, and cut off filter of infrared rays for an opto-electronic integrated circuit, electrical and optical elements being incorporated in the same substrate.

Moreover, the infrared absorbent of the present invention is variously adaptable according to its infrared absorbing characteristics. For example, when the infrared absorbent is added to a jet printer ink as described in Japanese patent application (OPI) No. 135568/81, a reading efficiency by near-infrared rays may be improved, and further it is applicable to a laser recording/reading medium as described in Japanese patent application (OPI) No. 11090/82. The infrared absorbent according to the present invention has a property such as converting absorbed near-infrared rays to heat, and therefore it may be utilized as an infrared rays/heat exchanger. Typical examples of such a converter are as follows:

(1) The infrared absorbent is added to a laser heat sensitive recording material as described in Japanese patent application (OPI) Nos. 14095/82 and 14096/82, and an infrared laser is irradiated to the composition to generate heat, thereby enhancing a mixed coloring reaction.

(2) The infrared absorbent may be contained in a resist material as described in Japanese patent application (OPI) No. 40256/82 which material may change solubility by a thermal function due to a laser.

(3) The infrared absorbent may be incorporated in a thermodrying or thermosetting composition as described in Japanese patent application (OPI) No. 143242/81 to the promote reaction.

Furthermore, the infrared absorbent of the present invention may be utilized for an electrophotosensitive film for an electrophotoprinter using a semiconductor laser as a light source as described in Japanese patent application (OPI) No. 214162/83, and may be also utilized for an optical disc film which permits writing and reproducing by a semiconductor laser.

It should be noted that applications of the infrared absorbent of the present invention are not limited to the above description.

EXAMPLES

To further illustrate this invention, and not by way of limitation, the following examples are given.

In synthesizing the exemplified compounds of the present invention, the bis(triphenylphosphine) iminium salt used for introduction of a cation moiety is synthesized according to R. Appel and A. Hauss's method (Z. Anorg. Allgem. Chem., 311 290 (1961)), but those on the market may also be utilized. For example, the bis(-triphenylphosphine) iminium chloride used in the following Reference Examples was an article on the market (by Alfa Co.).

Reference Example 1

Synthesis of the exemplified compound (2)

(1-1) Synthesis of bis(tetraethylammonium)-bis-(1,3-dithiol-2-thion-4,5-dithiolato) zinc complex Reaction was conducted in an argon atmosphere throughout the procedure. Into small pieces, 23 g of sodium was cut, and dispersed in 180 ml of carbon disulfide. Then, 200 ml of dimethylformamide was slowly added dropwise thereto with stirring. At this time, attention was paid not to cause vigorous heat generation. After completion of the addition of dimethylformamide, the reaction solution was gently heated carefully and refluxed for 24 hours. After completion of the reaction, unreacted sodium was filtered off. Then, 50 ml of ethanol was added to the filtrate, and stirred at room temperature for 2 hours. The carbon disulfide was distilled off at room temperature under reduced pressure from the solution. Then, 300 ml of water was slowly added dropwise to the solution, and filtered.

Preliminarily, into 500 ml of methanol, 20 g of zinc chloride was dissolved, and 500 ml of concentrated aqueous ammonia was added thereto to prepare a solution. Such a solution was added to the above-obtained reaction solution at room temperature and stirred for 5 min. Thereafter, a solution of 53 g of tetraethylammonium bromide in 250 ml of water was added thereto to instantly give a red precipitate. The precipitate was filtered off, and air-dried to give the above-captioned zinc complex.

(1-2) Synthesis of 4,5-bis(benzoylthio)-1,3-dithiol-2-thion

Into 500 ml of acetone, 22 g of zinc complex obtained in (1-1) was dissolved and filtered. The filtrate was stirred, and 150 ml of benzoyl chloride was added thereto to instantly obtain a yellow precipitate. The precipitate was filtered off, washed with water and air-dried to give 16 g of the above-captioned compound.

(1-3) Synthesis of bis(tetrabutylphosphonium)-bis(1,3-dithiol-2-thion-4,5-dithiorato) nickel (II) complex Into 50 ml of methanol, 9.2 g of the bis-(benzoylthio) product obtained in (1-2) was dissolved. Then, 6.3 g of 28% methanol solution of sodium methoxide was added thereto, and stirred for 10 min. To the solution, a solution of 2.4 g of nickel chloride (hexahydrate) in 50 ml of methanol was added, and stirred at room temperature for 30 min. To the solution, a solution of 8.5 g of tetrabutylphosphonium bromide in 100 ml of methanol was added to instantly give a black precipitate. Further, the precipitate was stirred for 20 min, filtered, washed with acetone and air-dried. Then, the precipitate was recrystallized from the acetone-isopropyl alcohol to obtain the above-captioned compound. (yield 3.8 g)

(1-4) Synthesis of tetrabutylphosphonium-bis(1,3-dithiol-2-thion-4,5-dithiorato) nickel (III) complex (exemplified compound (2))

Into 60 ml of acetone, 1 g of the nickel complex obtained in (1-3) was dissolved, and 30 ml of acetic acid was added thereto. Then, the solution was stirred for 3 hours, and the solvent was distilled off to precipitate a black crystal. The crystallized product was recrystallized from acetone-methanol to give the above-captioned exemplified compound (2). (yield 0.4 g; m.p. 185°

C.; $\lambda_{max}$ 1125 nm; $\epsilon_{max}$ $2.51\times10^4$(l.mol$^{-1}$.cm$^{-1}$,in $CH_2Cl_2$))

REFERENCE EXAMPLE 2

Synthesis of the exemplified compound (6)

(1-1) Synthesis of bis(tetraethylammonium)-bis-(1,2-dithiol-3-thion-4,5-dithiolato) zinc complex Reaction was conducted in an argon atmosphere throughout the procedure. Into small pieces, 23 g of sodium was cut, and dispersed in 180 ml of carbon disulfide. Then, 200 ml of dimethylformamide was slowly added dropwise thereto with stirring. At this time, care was taken not to cause vigorous heat generation. After completion of addition of dimethylformamide, the reaction solution was gently heated carefully and refluxed for 24 hours. After completion of the reaction, unreacted sodium was filtered off, and the carbon disulfide was distilled off at room temperature under reduced pressure from the filtrate. The obtained solution was stirred at 140° C. for 2 hours in an oil bath, and then allowed to cool to room temperature. To the solution, 50 ml of ethanol was added, and stirred at room temperature 2 hours. Further, 300 ml of water was slowly added thereto, and filtered.

Preliminarily, into 500 ml of methanol, 20 g of zinc chloride was dissolved, and 500 ml of concentrated aqueous ammonia was added thereto to prepare a solution. Such a solution was added to the above-obtained reaction solution at room temperature and stirred for 5 min. Thereafter, a solution of 53 g of tetraethylammonium bromide in 250 ml of water was added thereto to instantly give a red precipitate. The precipitate was filtered off, and air-dried to give the above-captioned zinc complex.

(1-2) Synthesis of 4,5-bis(benzoylthio)-1,3-dithiol-3-thion

Into 500 ml of acetone, 18 g of the zinc complex obtained in (1-1) was dissolved and filtered. The filtrate was stirred, and 150 ml of benzoyl chloride was added thereto to instantly give a yellow precipitate. The precipitate was filtered off, washed with water and air-dried to obtain 12 g of the above-captioned compound.

(1-3) Synthesis of bis(tetrabutylammonium)-bis(1,2-dithiol-3-thion-4,5-dithiorato) nickel (II) complex Into 50 ml of methanol, 9.2 g of the bis(benzoylthio) product obtained in (1-2) was dissolved. Then, 6.3 g of 28% methanol solution of sodium methoxide was added thereto, and stirred for 10 min. To the solution, a solution of 2.4 g of nickel chloride (hexahydrate) in 50 ml of methanol was added, and stirred at room temperature for 30 min. To the solution, a solution of 7.5 g of tetrabutylammonium bromide in 100 ml of methanol was added to instantly give a black precipitate. Further, the precipitate was stirred for 20 min, filtered, washed with acetone and air-dried. Then, the precipitate was recrystallized from acetone-isopropyl alcohol to obtain the above-captioned compound. (yield 2.8 g)

(1-4) Synthesis of tetrabutylammonium-bis(1,2-dithiol-3-thion-4,5-dithiorato) nickel (III) complex (exemplified compound (6))

Into 60 ml of acetone, 1 g of the nickel complex obtained in (1-3) was dissolved, and 30 ml of acetic acid was added thereto. Then, the solution was stirred for 3 hours, and the solvent was distilled off to precipitate a black crystal. The precipitate was recrystallized from acetone-methanol to give the above-captioned exemplified compound (6). (yield 0.3 g; m.p. 207° C.; $\lambda_{max}$ 1138 nm; $\epsilon_{max}$ $2.50\times10^4$ ( l.mol$^{-1}$.cm$^{-1}$, in $CH_2Cl_2$))

REFERENCE EXAMPLE 3:

Synthesis of the exemplified compound (24)

(1-1) Synthesis of bis(tetraethylammonium)-bis-(1,3-dithiol-2-thion-4,5-dithiolato) zinc complex Reaction was conducted in the atmosphere of argon throughout the procedure. Into small pieces, 23 g of sodium was cut, and dispersed in 180 ml of carbon disulfide. Then, 200 ml of dimethylformamide was slowly added dropwise thereto with stirring. At this time, care was taken not to cause vigorous heat generation. After completion of addition of dimethylformamide, the reaction solution was gently heated carefully and refluxed for 24 hours. After completion of the reaction, unreacted sodium was filtered off. Then, 50 ml of ethanol was added to the filtrate, and stirred at room temperature for 2 hours. The carbon disulfide was distilled off at room temperature under reduced pressure from the solution. Then, 300 ml of water was slowly added dropwise to the solution, and filtered.

Preliminarily, into 500 ml of methanol, 20 g of zinc chloride was dissolved, and 500 ml of concentrated aqueous ammonia was added thereto to prepare a solution. Such a solution was added to the above-obtained reaction solution at room temperature and stirred for 5 min. Thereafter, a solution of 53 g of tetraethylammonium bromide in 250 ml of water was added thereto to instantly form a red precipitate. The precipitate was filtered off, and air-dried to give the above-captioned zinc complex.

(1-2) Synthesis of 4,5-bis(benzoylthio)-1,3-dithiol-2-thion

Into 500 ml of acetone, 22 g of the zinc complex obtained in (1-1) was dissolved and filtered. The filtrate was stirred, and 150 ml of benzoyl chloride was added thereto to instantly form a yellow precipitate. The precipitate was filtered off, washed with water and air-dried to give 16 g of the above-captioned compound.

(1-3) Synthesis of bis(triphenylphosphine) iminium-bis(1,3-dithiol-2-thion-4,5-dithiorato) nickel (II) complex Into 50 ml of methanol, 9.2 g of the bis(benzoylthio) product obtained in (1-2) was dissolved. Then, 6.3 g of 28% methanol solution of sodium methoxide was added thereto, and stirred for 10 min. To the solution, a solution of 2.4 g of nickel chloride (hexahydrate) in 50 ml of methanol was added, and stirred at room temperature for 30 min. To the solution, a solution of 9.5 g of bis(triphenylphosphine) iminium chloride in 100 ml of methanol was added to instantly form a black precipitate. Further, the precipitate was stirred for 20 min, filtered, washed with acetone and air-dried. Then, the precipitate was recrystallized from acetone-isopropyl alcohol to give the above-captioned compound. (yield 4.0 g)

(1-4) Synthesis of triphenylphosphineiminiumbis(1,3-dithiol-2-thion-4,5-dithiorato) nickel (III) complex (exemplified compound (24))

Into 60 ml of acetone, 1 g of the nickel complex obtained in (1-3) was dissolved, and 30 ml of acetic acid was added thereto. Then, the solution was stirred for 3 hours, and the solvent was distilled off to precipitate a black crystal. The crystal product was recrystallized from acetone-methanol to give the above-captioned exemplified compound (24). (yield 0.4 g; m.p. 203° C.)

REFERENCE EXAMPLE 4

Synthesis of the exemplified compound (77)

(1) Preparation of bis(dithiobenzyl) nickel

In 700 ml of dioxane, 100 g of benzoin and 150 g of phosphorus pentasulfide were refluxed for 2 hours. The reacting solution was filtered, and allowed to cool. To the solution, a solution of 50 g of nickel chloride (hexahydrate) in 200 ml of water was added with stirring at room temperature. Thereafter, the solution was heated in water bath for 2 hours to form a black precipitate. The reacting solution was allowed to cool, filtered, washed with water and air-dried. The crystal precipitate was extracted from hot toluene by a Soxhlet extractor to give the above-captioned compound. (yield 37 g; m.p. 292° C., $\lambda_{max}$ 866 nm (in chloroform)). This melting point and absorption maximum are identical with those disclosed in G. N. Schrauzer et al., J. Am. Chem. Soc., 87, 1483 (1965).

(2) Synthesis of tetrabutylammonium-bis(dithiobenzyl) nickelate (exemplified compound (77))

In 4 ml of dimethyl sulfoxide, 1.14 g of the complex obtained in (1) was dissolved in the atmosphere of argon. To the solution, 0.6 g of para-phenylenediamine was added to instantly form a reddish brown solution. The solution was stirred at room temperature for 10 min. The reaction solution was poured into a solution of 1.4 g of tetrabutylammonium bromide in 100 ml of ethanol, and stirred to form a black precipitate. The precipitate was filtered off, washed with methanol, and air-dried. The crystal precipitate was recrystallized from acetone-ethanol to give a reddish violet crystal (exemplified compound (77)). (yield 0.82 g; m.p. 209°-212° C.; $\lambda_{max}$ 952 nm; $\epsilon_{max}$ $1.29\times10^4$(l.mol$^{-1}$.cm$^{-1}$, in chloroform))

REFERENCE EXAMPLE 5:

Synthesis of the exemplified compound (83)

(1) Preparation bis(dithio-p-methoxybenzyl) nickel

In 1300 ml of dioxane, 200 g of anisoin and 300 g of phosphorus pentasulfide were refluxed for 2 hours. The reaction solution was filtered, and allowed to cool. To the solution, a solution of 100 g of nickel chloride (hexahydrate) in 400 ml of water was added with stirring at room temperature. Thereafter, the solution was heated in water bath for 2 hours to form a black precipitate. The reaction solution was allowed to cool, filtered, washed with water and air-dried. The crystal precipitate was extracted from hot toluene by a Soxhlet extractor to give the above-captioned compound. (yield 81 g)

(2) Synthesis of tetrabutylammonium-bis(dithio-p-methoxybenzyl) nickelate (exemplified compound (83))

In 4 ml of dimethyl sulfoxide, 1.40 g of the complex obtained in (1) was dissolved in the atmosphere of argon. To the solution, 0.6 g of para-phenylenediamine was added to instantly form a reddish brown solution. The solution was stirred at room temperature for 10 min. The reaction solution was poured into a solution of 1.4 g of tetrabutylammonium bromide in 100 ml of ethanol, and stirred to form a black precipitate. The precipitate was filtered off, washed with ethanol, and air-dried. The crystal precipitate was recrystallized from acetone-methanol to give a reddish violet crystal (exemplified compound (83). (yield 0.67 g; m.p. 236°-238° C.; $\lambda_{max}$ 980 nm; $\epsilon_{max}$ $1.02\times10^4$(l mol$^{-1}$cm$^{-1}$, in chloroform))

REFERENCE EXAMPLE 6:

Synthesis of the exemplified compound (112)

In accordance with a method of G. Bähr and G. Schleitzer (Chem. Ber., 90, 438 (1957)), sodium cyanide, carbon disulfide and N,N-dimethylformamide were reacted with each other to prepare sodium cyanodithioformate (which contains three molecules of N,N-dimethylformamide as a crystal solvent.)

In 100 ml of water, 303 g of the dithioformate containing the crystal solvent as prepared above was dissolved, and heated in water bath for 30 min. Separated sulphur was filtered off, and a solution of 49 g of nickel chloride in 300 ml of water was added to the filtrate, and stirred at room temperature for 30 min. To the solution, a solution of 168 g of hexadecyltrimethylammonium bromide in 600 ml of ethanol was added at room temperature to instantly form a reddish black precipitate. The reaction solution was further stirred for 30 min, filtered, washed with water and air-dried. The crystal precipitate was recrystallized from hot acetone to give 130 g of yellowish red crystal.

The obtained crystal is a complex having a divalent (formal oxidation number) nickel as corresponding to the exemplified compound (110). In 10 ml of dimethyl sulfoxide, 6.8 g of the divalent complex was dissolved. To the solution, a solution of 2.3 g of iodine in 5 ml of dimethyl sulfoxide was added at a time, and stirred for 5 min. Then, 130 ml of ethanol was added to the solution to instantly precipitate a black crystal. The crystal precipitate was filtered off to give the above-captioned compound. (yield 4 g; m.p. 162°-163° C.)

REFERENCE EXAMPLE 7

Synthesis of the exemplified compound (118)

In 1 liter of water, 151 g of the sodium cyanodithioformate in crystal as prepared in a similar manner as in Reference Example 6 was dissolved, and heated in a water bath for 30 min. Separated sulphur was filtered off, and a solution of 24 g of nickel chloride in 400 ml of water was added to the filtrate, and stirred at room temperature for 30 min. To the solution, a solution of 145 g of hexadecyltrimethylphosphonium bromide in 300 ml of ethanol was added at room temperature to instantly form a reddish black precipitate. The reaction solution was filtered, washed with water and air-dried. The crystal precipitate was recrystallized from hot acetone to give 160 g of yellowish red crystal.

The obtained crystal is a complex having a divalent (formal oxidation number) nickel as corresponding to the exemplified compound (118).

In 25 ml of dimethyl sulfoxide, 9 g of the divalent complex was dissolved. To the solution, a solution of 2.3 g of iodine in 5 ml of dimethyl sulfoxide was added at a time at room temperature.

Then, the solution was heated in water bath at 50° C. for 10 min with occasionally stirring to completely dissolve the reactant. Then, 200 ml of ethanol was added to the reaction solution, and filtered. The filtrate was allowed to cool at −25° C. overnight to form a brown crystal. The crystal was filtered off, washed with ethanol, and air-dried to give the above-captioned compound. (yield 4 g; m.p. 147°-148° C.)

REFERENCE EXAMPLE 8:

Synthesis of the exemplified compound (155)

(1-1) Synthesis of (hexadecyl trimethylammonium)-bis-1,2-dicyano-1,2-ethylene dithiorato) nickelate (II)

In accordance with a method of G. Bähr and G. Schleitzer (Chem. Ber., 90, 438 (1957)), sodium cyanide, carbon disulfide and N,N-dimethylformamide were reacted with each other to obtain sodium cyanodithioformate (which contains three molecules of N,N-dimethylformamide as a crystal solvent). In 36 ml of water, 11 g of the sodium cyanodithioformate was dissolved, and heated in water bath for 20 min. Separated sulphur was filtered off, and the filtrate was cooled to room temperature. Then, 30 ml of ethanol was added to the filtrate. A solution of 1.73 g of nickel chloride (hexahydrate) in 11 ml of water was added to the obtained solution, and stirred at room temperature for 5 min. To the solution, a solution of 6.08 g of hexadecyltrimethylammonium bromide in 18 ml of ethanol was added to instantly form a precipitate. The reaction solution was further stirred for 10 min at room temperature, filtered, washed with water and air-dried. The crystal precipitate was recrystallized from hot acetone-n-hexane to give 6 g of red crystal of the above-captioned nickel (II) complex.

(1-2) Synthesis of bis(dithio-p-methoxybenzyl) nickel (IV) complex

In 350 ml of dioxane, 50 g of anison and 50 g of phosphorus pentasulfide were refluxed for 2 hours. The reaction solution was allowed to cool and filtered. To the filtrate, a solution of 25 g of nickel chloride (hexahydrate) in 100 ml of water was added to instantly form a precipitate. Thereafter, the solution was heated in water bath for one and half hours, and allowed to cool. The reaction solution was filtered to give a black precipitate. The precipitate was filtered off, washed with water, and air-dried. The crystal precipitate was extracted from toluene by a Soxhlet extractor to give 36 g of a black crystal of the above-captioned nickel (IV) complex.

(1-3) Synthesis of the exemplified compound (155)

In 150 ml of acetone, 0.55 g of the nickel (II) complex obtained in (1-1) and 0.40 g of the nickel (IV) complex obtained in (1-2) were dissolved and refluxed for 12 hours. Then, the hot solution was filtered, and the filtrate was condensated. A hot methanol was added to the filtrate, and allowed to cool overnight to precipitate a dark orange crystal of the exemplified compound (155). (yield 0.50 g; m.p. 231°-232° C.; $\lambda_{max}$ 927 nm; $\epsilon_{max}$ $0.72\times10^4$ ( $l.mol^{-1}.cm^{-1}$, in $CHCl_3$))

REFERENCE EXAMPLE 9:

Synthesis of the exemplified compound (194)

(2-1) Synthesis of bis(tetrabutylammonium)-bis-(1,3-dithiol-2-thion-4,5-dithiorato) nickelate (II)

(2-1-1) Synthesis of bis(tetraethylammonium)-bis-(1,3-dithiol-2-thion-4,5-dithiolato) zinc complex Reaction was conducted in the atmosphere of argon throughout the procedure. Into small pieces, 23 g of sodium was cut, and dispersed in 180 ml of carbon disulfide. Then, 200 ml of dimethylformamide was slowly added dropwise thereto with stirring. At this time, care was taken not to cause vigorous heat generation. After completion of addition of dimethyl formamide, the reaction solution was gently heated carefully and refluxed for 24 hours. After completion of the reaction, unreacted sodium was filtered off. Then, 50 ml of ethanol was added to the filtrate, and stirred at room temperature for 2 hours. The carbon disulfide was distilled off at room temperature under reduced pressure from the solution. Then, 300 ml of water was slowly added dropwise to the solution, and filtered.

Preliminarily, into 500 ml of methanol, 20 g of zinc chloride was dissolved, and 500 ml of concentrated aqueous ammonia was added thereto to prepare a solution. Such solution was added to the above-obtained reaction solution at room temperature and stirred for 5 min. Thereafter, a solution of 53 g of tetraethylammonium bromide in 250 ml of water was added thereto to instantly form a red precipitate. The precipitate was filtered off, and air-dried to give the above-captioned zinc complex.

(2-1-2) Synthesis of 4,5-bis(benzoylthio)-1,3-dithiol-2-thion

Into 500 ml of acetone, 22 g of the zinc complex obtained in (2-1-1) was dissolved and filtered. The filtrate was stirred, and 150 ml of benzoyl chloride was added thereto to instantly form a yellow precipitate. The precipitate was filtered off, washed with water and air-dried to give 16 g of the above-captioned compound.

(2-1-3) Synthesis of bis(tetrabutylammonium)-bis(1,3-dithiol-2-thion-4,5-dithiorato) nickel (II) complex Into 50 ml of methanol, 9.2 g of the bis(benzoylthio) product obtained in (2-1-2) was dissolved. Then, 6.3 g of 28% methanol solution of sodium methoxide was added thereto, and stirred for 10 min. To the solution, a solution of 2.4 g of nickel chloride (hexahydrate) in 50 ml of methanol was added, and stirred at room temperature for 30 min. To the solution, a solution of 8.5 g of tetrabutylammonium bromide in 100 ml of methanol was added to instantly form a black precipitate. Further, the precipitate was stirred for 20 min, filtered, washed with acetone and air-dried. Then, the crystal was recrystallized from acetone-isopropyl alcohol to give the above-captioned compound. (yield 3.8 g)

(2-2) Synthesis of bis(dithiobenzyl) nickel (IV) complex

In 350 ml of dioxane, 50 g of benzoin and 75 g of phosphorus pentasulfide were refluxed for 2 hours. The reaction solution was allowed to cool and filtered. To the filtrate, a solution of 25 g of nickel chloride (hexahydrate) in 100 ml of water was added to instantly form a precipitate. Thereafter, the solution was heated in water bath for one and half hours, and allowed to cool. The reaction solution was filtered to obtain a black precipitate. The precipitate was filtered off, washed with water, and air-dried. The crystal was extracted from toluene by a Soxhlet extractor to give 43 g of a black crystal of the above-captioned compound.

(2-3) Synthesis of the exemplified compound (194)

In 150 ml of acetone, 0.57 g of the nickel (II) complex obtained in (2-1) and 0.33 g of the nickel (IV) complex obtained in (2-2) were dissolved and refluxed for 12 hours. Then, the solution was filtered, and the filtrate was condensated. A hot methanol was added to the filtrate, and allowed to cool at −25° C. overnight to precipitate a dark orange crystal of the exemplified compound (194). (yield 0.30 g; m.p. 280°-281° C.; $\lambda_{max}$ 1015 nm; $\epsilon_{max}$ $1.31\times10^4$ ( $l.mol^{-1}.cm^{-1}$, in $CHCl_3$))

REFERENCE EXAMPLE 10

Synthesis of the exemplified compound (241)

(3-1) Synthesis of tetrabutylammonium bis(quinoxalinedithiorato) nickelate (II)

Into a solution of 48.4 g of 28% solution of sodium methoxide diluted in 300 ml of methanol, 14.4 g of quinoxalinedithiol was added and dissolved. To the solution, a solution of 5.8 g of nickel chloride (hexahydrate) in 100 ml of methanol was added little by little. Thereafter, the solution was stirred at room temperature for 30 min. Then, to the solution, a solution of 17.2 g of tetrabutylammonium bromide in 100 ml of methanol was added and stirred at room temperature for 30 min. Then, 300 ml of water was added thereto, and an undissolved matter was filtered off. The obtained precipitate was washed with water and air-dried. This was dissolved in a small quantity of hot acetone, and ethanol was added thereto and allowed to cool. The precipitated crystal was filtered off to obtain 8.6 g of a black crystal of the above-captioned compound.

(3-2) Synthesis of bisdithiobenzyl nickel (IV)

The compound as synthesized in (2-2) was used.

(3-3) Synthesis of the exemplified compound (241)

In 150 ml of acetone, 0.57 g of the nickel (II) complex obtained in (3-1) and 0.33 g of the nickel (IV) complex obtained in (2-2) were dissolved and refluxed for 5 hours. Then, the hot solution was filtered, and the filtrate was condensated. A hot ethanol was added to the filtrate, and allowed to cool to obtain a dark reddish violet crystal of the exemplified compound (241). (yield 0.43 g; m.p. 263°-264° C.; $\lambda_{max}$ 972 nm; $\epsilon_{max}$ $1.15\times10^4$ ($l.mol^{-1}.cm^{-1}$, in $CHCl_3$))

EXAMPLE 1

An infrared absorbing composition was prepared by using the exemplified compound (2) synthesized in Reference Example 1 to form an optical filter. That is, each component in the following composition as shown in parts by weight was mixed and stirred, and the mixture was filtrated and applied onto a metal support by a casting method to form a film. Then, the film was peeled off to give a desired optical filter. Several kinds of optical filters having thickness of dry films varied in the range of 0.02 to 0.3 mm were obtained. An optical density of the optical filter (thickness 25μ) as obtained above is shown in FIG. 1.

| Composition | |
|---|---|
| TAC (cellulose triacetate) | 170 parts |
| TPP (triphenyl phosphate) | 10 parts |
| methylene chloride | 800 parts |
| methanol | 160 parts |
| exemplified compound (2) | 2 parts |

EXAMPLE 2

In a manner similar to that in Example 1, an optical filter of 0.19 mm thickness containing an ultraviolet absorbent was prepared. Composition in a casting method is as follows:

| | |
|---|---|
| TAC (cellulose triacetate) | 170 parts |
| TPP (triphenyl phosphate) | 10 parts |
| methylene chloride | 800 parts |
| methanol | 160 parts |
| exemplified compound (2) | 2 parts |

-continued

| | |
|---|---|
| 2-(5-tert-butyl-2-hydroxyphenyl)-benzotriazole | 0.2 parts |

EXAMPLE 3

The optical filter (thickness 0.05 mm) prepared in Example 1 as an ultraviolet cut filter was mounted to a silicon photo diode. As a result, an operational performance of a photosensor was remarkably improved. Further, even after a forced aging test at 50° C., an operational reliability was not varied at all.

Use of an ultraviolet absorbent in combination with the metal complex of the present invention remarkably improves fastness to light of the filter. In the case that the exemplified compound (2) and 2-(5-tert-butyl-2-hydroxyphenyl)benzotriazole (compound (U)) as the ultraviolet absorbent were used in combination in the weight ratio of 10:1, light fastness of such a filter is shown in Table 7, in which a change in optical density of the filter under the condition of irradiation of light with a time elapsed is shown.

TABLE 7

| Complex in filter | Irradiation time of xenon lamp (120,000 lux) 0 1125 nm | 24 hours. 1125 nm |
|---|---|---|
| Exemplified compound (2) | 0.88 | 0.73 |
| Exemplified compound (2) + Compound (U) | 0.88 | 0.83 |

As will be apparent from Table 7, when the compound of the present invention and the ultraviolet absorbent are used in combination, light resistance and fastness of the optical filter may be remarkably improved.

EXAMPLE 4

An optical filter was prepared by using the exemplified compounds synthesized in Reference Example 3. That is, each component in the following composition as shown in parts by weight was mixed and stirred, and the mixture was filtrated and applied onto a metal support by a casting method to form a film. Then, the film was peeled off to give a desired optical filter. Several kinds of optical filters having thickness of dry films varied in the range of 0.05 to 0.3 mm were obtained.

| Composition | |
|---|---|
| TAC (cellulose triacetate) | 170 parts |
| TPP (triphenyl phosphate) | 10 parts |
| methylene chloride | 800 parts |
| methanol | 160 parts |
| exemplified compound (24) | 2 parts |

Figure 3:
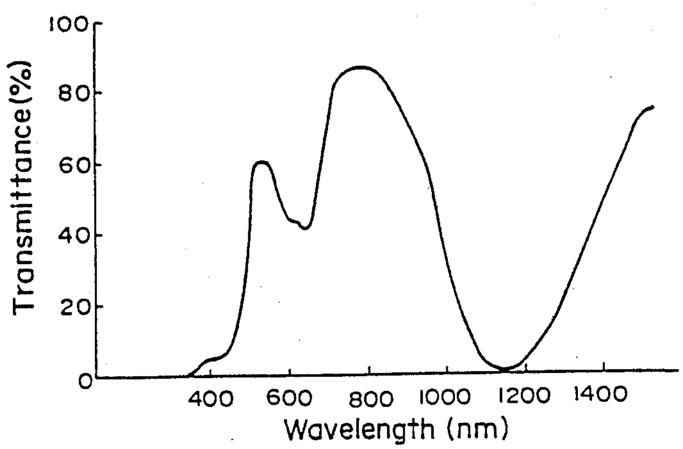
FIG. 3 is a graph of a spectral transmittance curves of the optical filter obtained in Example 4.

A spectral transmittance of the optical filter is shown in FIG. 3. A thickness of the filter material as tested is 0.1 mm.

EXAMPLE 5

In a manner similar to that in Example 1, an optical filter of 0.19 mm thickness containing an ultraviolet absorbent was prepared. Composition in a casting method is as follows:

| | |
|---|---|
| TAC (cellulose triacetate) | 170 parts |
| TPP (triphenyl phosphate) | 10 parts |
| methanol | 160 parts |
| exemplified compound (24) | 2 parts |
| 2-(5-tert-butyl-2-hydroxyphenyl)-benzotriazole | 0.2 parts |

(i) Light fastness test

Light fastness was tested with respect to exemplified compound (24) and the corresponding ammonium complex, the following comparative compound (A).

(A)

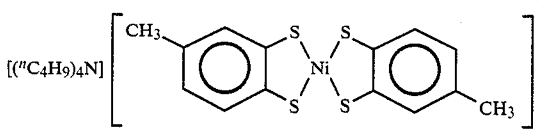

The test was carried out in the following manner, that is, filters of 0.19 mm thickness were prepared by using the above-mentioned two compounds according to the composition similar to that in Example 4, and a xenon lamp (120,000 lux) was irradiated to the filter to measure a change in transmittance (%) with a time elapsed. The test results are shown in Table 8.

TABLE 8

| Complex in filter | Irradiation time of xenon lamp (120,000 lux) 0 560 nm | 0 908 nm | 24 hrs. 560 nm | 24 hrs. 908 nm |
|---|---|---|---|---|
| Exemplified compound (24) | 78% | 0% | 63% | 13% |
| Comparative compound (A) | 78% | 0% | 54% | 29% |

Use of an ultraviolet absorbent in combination with the iminium complex of the present invention remarkably improves light fastness of the filter. In the case that the exemplified compound (24) and 2-(5-tert-butyl-2-hydroxyphenyl)benzotriazole (compound (U)) as the ultraviolet absorbent were used in combination in the weight ratio of 10:1, light fastness of the filter is shown in Table 9, in which a change in transmittance of the filter under the condition of irradiation of light with a time elapsed as shown.

TABLE 9

| Complex in filter | Irradiation time of xenon lamp (120,000 lux) 0 560 nm | 0 908 nm | 24 hrs. 560 nm | 24 hrs. 908 nm |
|---|---|---|---|---|
| Exemplified compound (24) | 78% | 0% | 63% | 13% |
| Exemplified compound (24) + Compound (U) | 80% | 0% | 78% | 2% |

As will be apparent from Table 9, when the compound of the present invention and the ultraviolet absorbent are used in combination, light resistance and fastness of the optical filter can be remarkably improved.

EXAMPLE 6

Figure 4:
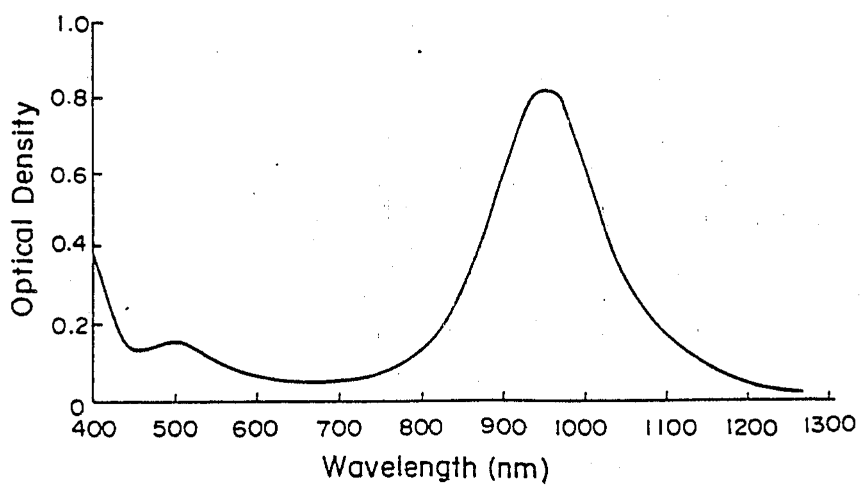
FIG. 4 is a graph of an optical density curve of the optical filter obtained in Example 6.

An infrared absorbing composition was prepared by using the exemplified compound (77) synthesized in Reference Example 4 to form an optical filter. That is, each component in the following composition as shown in parts by weight was mixed and stirred, and the mixture was filtrated and applied onto a metal support by a casting method to form a film. Then, the film was peeled off to give a desired optical filter. Several kinds of optical filters having thickness of dry films varied in the range of 0.02 to 0.3 mm were obtained. An optical density of the optical filter (thickness 40μ) as obtained above is shown in FIG. 4.

| Composition | |
|---|---|
| TAC (cellulose triacetate) | 170 parts |
| TPP (triphenyl phosphate) | 10 parts |
| methylene chloride | 800 parts |
| methanol | 160 parts |
| exemplified compound (77) | 2 parts |

EXAMPLE 7

Figure 5:
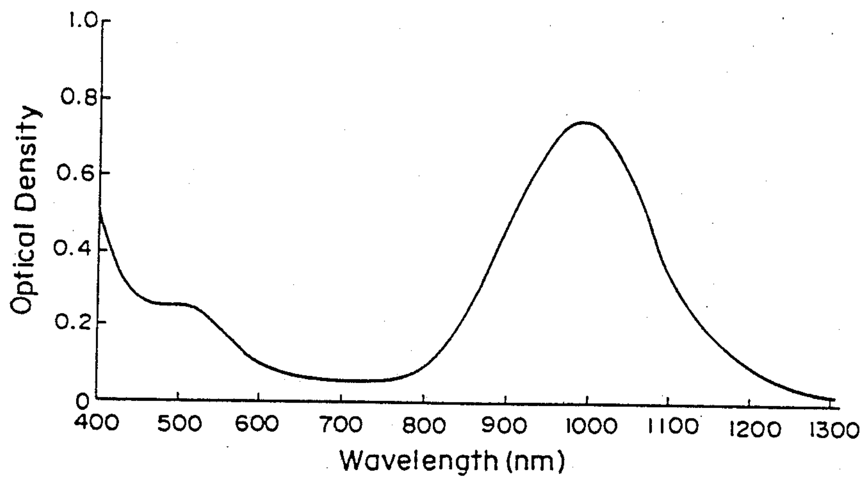
FIG. 5 is a graph of an optical density curve of the optical filter obtained in Example 7.

In a manner similar to that in Example 6, an optical filter of 0.19 mm thickness containing an ultraviolet absorbent was prepared. An optical density of the optical filter is shown in FIG. 5. Composition in a casting method is as follows:

| | |
|---|---|
| TAC (cellulose triacetate) | 170 parts |
| TPP (triphenyl phosphate) | 10 parts |
| methylene chloride | 800 parts |
| methanol | 160 parts |
| exemplified compound (77) | 2 parts |
| 2-(5-tert-butyl-2-hydroxyphenyl)-benzotriazole | 0.2 parts |

EXAMPLE 8

The optical filter (thickness 0.05 mm) prepared in Example 6 as an ultraviolet cut filter was mounted to a silicon photo diode. As a result, an operational performance of a photosensor was largely improved. Further, even after a forced aging test at 50° C., an operational reliability was not varied at all.

Use of an ultraviolet rays absorbent in combination with the metal complex of the present invention remarkably improves light fastness of the filter. In the case that the exemplified compound (77) and 2-(5-tert-butyl-2-hydroxyphenyl)benzotriazole (compound (U)) as the ultraviolet absorbent were used in combination in the weight ratio of 10:1, light fastness of such a filter is shown in Table 10, in which a change in optical density of the filter under the condition of irradiation of light with a time elapsed is shown.

TABLE 10

| Complex in filter | Irradiation time of xenon lamp (120,000 lux) 0 953 nm | 24 hrs. 953 nm |
|---|---|---|
| Exemplified compound (77) | 0.82 | 0.73 |
| Exemplified compound (77) + Compound (U) | 0.82 | 0.80 |

As will be apparent from Table 10, when the compound of the present invention and the ultraviolet absorbent are used in combination, light resistance and fastness of the optical filter can be improved.

EXAMPLE 8

Figure 6:
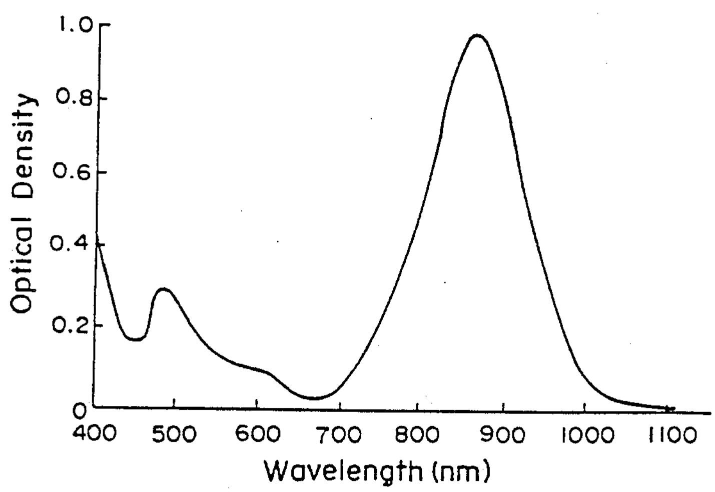
FIG. 6 is a graph of an optical density curve of the optical filter obtained in Example 8.

An infrared absorbing composition was prepared by using the exemplified compound (118) synthesized in Reference Example 7 to form an optical filter. That is, each component in the following composition as shown in parts by weight was mixed and stirred, and the mixture was filtrated and applied onto a metal support by a casting method to form a film. Then, the film was peeled off to give the desired optical filter. Several kinds of optical filters having thickness of dry films varied in the range of 0.02 to 0.3 mm were obtained. An optical density of the optical filter (thickness, about 60μ) as obtained above is shown in FIG. 6.

| Composition | |
|---|---|
| TAC (cellulose triacetate) | 170 parts |
| TPP (triphenyl phosphate) | 10 parts |
| methylene chloride | 800 parts |
| methanol | 160 parts |
| exemplified compound (118) | 2 parts |

EXAMPLE 9

In a manner similar to that in Example 8, an optical filter of 0.19 mm thickness containing an ultraviolet absorbent was prepared. Composition in a casting method is as follows:

| | |
|---|---|
| TAC (cellulose triacetate) | 170 parts |
| TPP (triphenyl phosphate) | 10 parts |
| methylene chloride | 800 parts |
| methanol | 160 parts |
| exemplified compound (118) | 2 parts |
| 2-(5-tert-butyl-2-hydroxyphenyl)-benzotriazole | 0.2 parts |

EXAMPLE 10

The optical filter (thickness 0.05 mm) prepared in Example 8 as an ultraviolet cut filter was mounted to a silicon photo diode. As a result, an operational performance of a photosensor was distinctly improved. Further, even after a forced aging test at 50° C., an operational reliability was not varied at all.

Use of an ultraviolet absorbent in combination with the metal complex of the present invention remarkably improves light fastness of the filter. In the case that the exemplified compound (118) and 2-(5-tert-butyl-2-hydroxyphenyl)benzotriazole (compound (U)) as the ultraviolet absorbent were used in combination in the weight ratio of 10:1, light fastness of such a filter is shown in Table 11, in which a change in optical density of the filter under the condition of irradiation of light with a time elapsed is shown.

TABLE 11

| Complex in filter | Irradiation time of xenon lamp (120.000 lux) 0 862 nm | 24 hrs. 862 nm |
|---|---|---|
| Exemplified compound (118) | 1.00 | 0.68 |
| Exemplified compound (118) + Compound (U) | 1.00 | 0.93 |

As will be apparent from Table 11, when the compound of the present invention and the ultraviolet absorbent are used in combination, light fastness of the optical filter can be remarkably improved.

EXAMPLE 11

Figure 7:
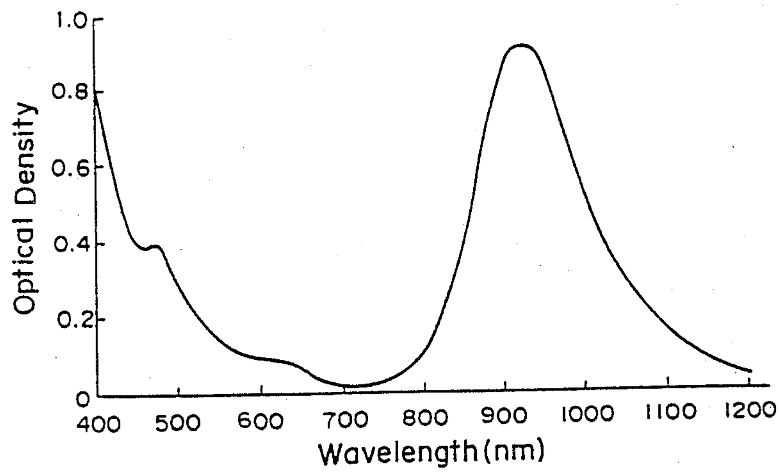
FIG. 7 is a graph of an optical density curve of the optical filter obtained in Example 11.

An infrared absorbing composition was prepared by using the exemplified compound (155) synthesized in Reference Example 8 to form an optical filter. That is, each component in the following composition as shown in parts by weight was mixed and stirred, and the mixture was filtrated and applied onto a metal support by a casting method to form a film. Then, the film was peeled off to give a desired optical filter. Several kinds of optical filters having thickness of dry films varied in the range of 0.02 to 0.3 mm were obtained. An optical density of the optical filter (thickness 95μ) as obtained above is shown in FIG. 7.

| Composition | |
|---|---|
| TAC (cellulose triacetate) | 170 parts |
| TPP (triphenyl phosphate) | 10 parts |
| methylene chloride | 800 parts |
| methanol | 160 parts |
| exemplified compound (155) | 2 parts |

EXAMPLE 12

Figure 8:
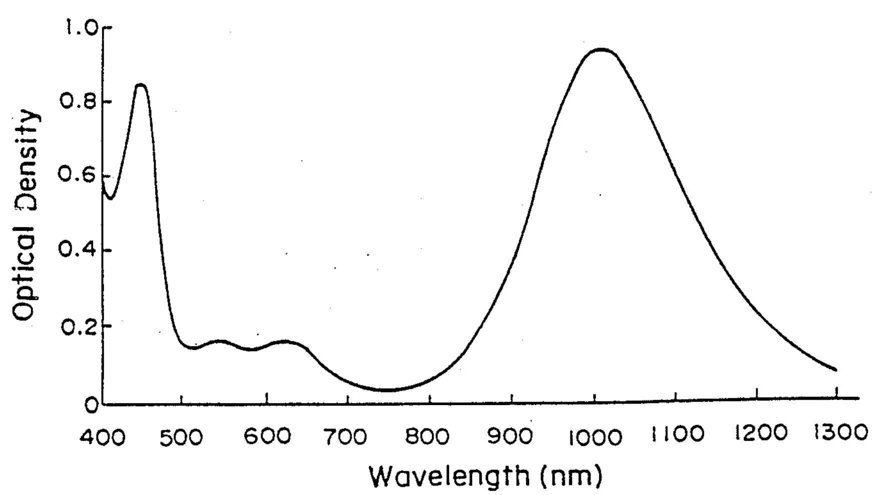
FIG. 8 is a graph of an optical density curve of the optical filter obtained in Example 12.

An infrared absorbing composition was prepared by using the exemplified compound (194) synthesized in Reference Example 9 to form an optical filter. That is, each component in the following composition as shown in parts by weight was mixed and stirred, and the mixture was filtrated and applied onto a metal support by a casting method to form a film. Then, the film was peeled off to give a desired optical filter. Several kinds of optical filters having thickness of dry films varied in the range of 0.02 to 0.3 mm were obtained. An optical density of the optical filter (thickness 60μ) as obtained above is shown in FIG. 8.

| Composition | |
|---|---|
| TAC (cellulose triacetate) | 170 parts |
| TPP (triphenyl phosphate) | 10 parts |
| methylene chloride | 800 parts |
| methanol | 160 parts |
| exemplified compound (194) | 2 parts |

EXAMPLE 13

Figure 9:
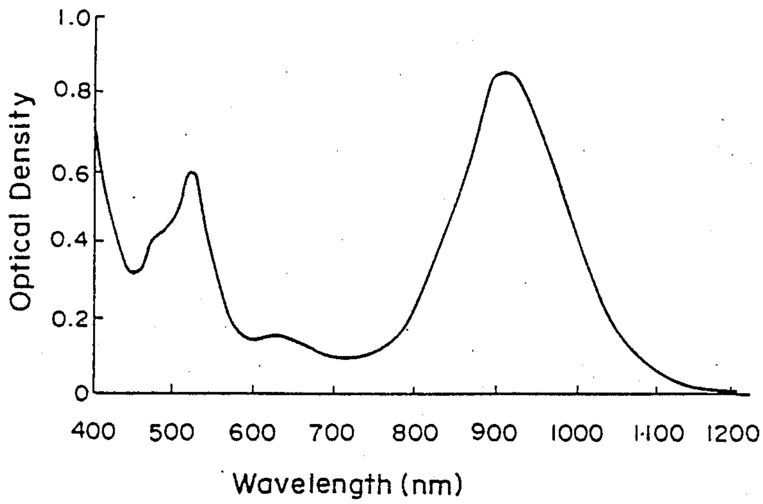
FIG. 9 is a graph of an optical density curve of the optical filter obtained in Example 13.

An infrared absorbing composition was prepared by using the exemplified compound (241) synthesized in Reference Example 10 to form an optical filter. That is, each component in the following composition as shown in parts by weight was mixed and stirred, and the mixture was filtrated and applied onto a metal support by a casting method to form a film. Then, the film was peeled off to give a desired optical filter. Several kinds of optical filters having thickness of dry films varied in the range of 0.02 to 0.3 mm were obtained. An optical density of the optical filter (thickness 60μ) as obtained above is shown in FIG. 9.

| Composition | |
|---|---|
| TAC (cellulose triacetate) | 170 parts |
| TPP (triphenyl phosphate) | 10 parts |

-continued

| Composition | |
|---|---|
| methylene chloride | 800 parts |
| methanol | 160 parts |
| exemplified compound (241) | 2 parts |

EXAMPLE 14

In a manner similar to that in Example 1, an optical filter of 0.19 mm thickness containing an ultraviolet absorbent was prepared. Composition in a casting method is as follows:

| | |
|---|---|
| TAC (cellulose triacetate) | 170 parts |
| TPP (triphenyl phosphate) | 10 parts |
| methylene chloride | 800 parts |
| methanol | 160 parts |
| exemplified compound (155) | 2 parts |
| 2-(5-tert-butyl-2-hydroxyphenyl)-benzotriazole | 0.2 parts |

EXAMPLE 15

The optical filter (thickness 0.05 mm) prepared in Example 11 as an ultraviolet cut filter was mounted to a silicon photo diode. As a result, an operational performance of a photosensor was remarkably improved. Further, even after a forced aging test at 50° C., an operational reliability was not varied at all.

Use of an ultraviolet absorbent in combination with the metal complex of the present invention remarkably improves light resistance of the filter. In the case that the exemplified compound (155) and 2-(5-tert-butyl-2-hydroxyphenyl)benzotriazole (compound (U)) as the ultraviolet absorbent were used in combination in the weight ratio of 10:1, light fastness of such a filter material is shown in Table 12, in which a change in optical density of the filter under the condition of irradiation of light with a time elapsed is shown.

TABLE 12

| Complex in filter | Irradiation time of xenon lamp (120,000 lux) 0 927 nm | 24 hrs. 927 nm |
|---|---|---|
| Exemplified compound (155) | 0.92 | 0.73 |
| Exemplified compound (155) + Compound (U) | 0.92 | 0.88 |

As will be apparent from Table 12, when the compound of the present invention and the ultraviolet rays absorbent are used in combination, light fastness of the optical filter can be remarkably improved.

REFERENCE EXAMPLE 11

Synthesis of the exemplified compound (4)

(1-1) Synthesis of bis (hexadecyltrimethylammonium)-bis (1, 3-dithiol-2-thion-4,5-dithiolato) nickel (II) complex Into 50 ml of methanol, 9.2 g of the bis-(benzoylthio) product obtained in (1-2) of Reference Example 1 was dissolved. Then, 9.2 g of 28% methanol solution of sodium methoxide was added thereto, and stirred for 30 min. To the solution, a solution of 2.4 g of nickel chloride (hexahydrate) in 50 ml of methanol was added, and stirred at room temperature for 30 min. To the solution, a solution of 10.0 g of hexadecyltrimethylammonium bromide in 150 ml of methanol was added to instantly give a black precipitate. Further, the precipitate was stirred for 20 min, filtered, washed with acetone and air-dried. Then, the precipitate was recrystallized from acetone-isopropyl alcohol to obtain the above-captioned compound. (yield 5.1 g).

(1-2) Synthesis of exemplified compound (4)

Into 60 ml of acetone, 1 g of the nickel complex obtained in (1-1) was dissolved, and 30 ml of acetic acid was added thereto. Then, the solution was stirred for 3 hours, and the solvent was distilled off to precipitate a black crystal. The crystallized product was recrystallized from acetone-methanol to give the above-captioned exemplified compound (4). (yield 0.6 g; m.p. 181° C.; $\lambda_{max}$ 1138 nm; $\epsilon_{max}$ $2.50\times10^4$l.mol$^{-1}$.cm$^{-1}$, in $CH_2Cl_2$))

REFERENCE EXAMPLE 12

Synthesis of the exemplified compound (78)

In 4 ml of dimethyl sulfoxide, 1.14 g of the complex obtained in (1) of Reference Example 4 was dissolved in the atmosphere of argon. To the solution, 0.6 g of para-phenylenediamine was added to instantly form a reddish brown solution. The solution was stirred at room temperature for 10 min. The reaction solution was poured into a solution of 2.2 g of hexadecyltrimethylammonium bromide in 100 ml of ethanol, and stirred to form a black precipitate. The precipitate was filtered off, washed with methanol, and air-dried. The crystal precipitate was recrystallized from acetone-ethanol to give a dark red crystal (exemplified compound (78)). (yield 1.0 g; m.p. 167°~169° C.; $\lambda_{max}$ 953 nm; $\epsilon_{max}$ $1.30\times10^4$ ( l.mol$^{-1}$.cm$^{-1}$, in chloroform))

Having described a specific embodiment of our invention, it is believed obvious that any modification and variation of our invention is within the scope of the present invention in view of the above teachings.

What we claim is:

1. A metal complex compound useful as an infrared absorbent prepared by coordinating two bidentate ligands of the following formula (iii) to a center metal selected from the group consisting of nickel, copper, cobalt, palladium and platinum and neutralizing such a complex with a phosphonium cation

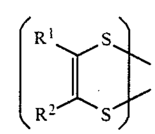

(iii)

wherein, $R^1$ and $R^2$ each independently represents a hydrogen atom, cyano group, or a substituted or unsubstituted alkyl, aryl or heterocyclic group, which may be the same or different.

2. The compound as in claim 1, wherein said cation for neutralizing said complex is a quaternary phosphonium ion.

3. The compound as in claim 1, wherein said cation is a quaternary phosphonium ion containing 4 or more of total carbon atoms in its alkyl group.

4. The compound as in claim 1, wherein said $R^1$ and $R^2$ of said metal complex compounds are selected from a group consisting of a hydrogen atom, cyano group, and a substituted or unsubstituted alkyl, aryl or heterocyclic group which may be bonded through a divalent connecting group derived from an oxy group (-O-), thio group (-S-), amino group, oxycarbonyl group, carbonyl group, carbamoyl group, sulfamoyl group, carbonylamino group, sulfonyl group or carbonyloxy group to a benzene ring, and a group of nonmetal atoms forming at least one substituted or unsubstituted five-membered or six-membered ring by bonding of $R^1$ and $R^2$.

5. The compound as in claim 1, wherein said compound is a metal complex compound represented by the following formula (V)

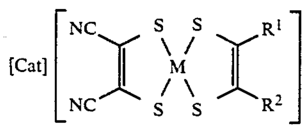

(V)

wherein, Cat represents a phosphonium cation for neutralizing said complex; M represents nickel, copper, cobalt, palladium or platinum; and $R^1$ and $R^2$ each independently represents a hydrogen atom, cyano group, or a substituted or unsubstituted alkyl, aryl or heterocyclic group, which may be the same or different.

6. The compound as in claim 5, wherein said cation for neutralizing said complex is a quaternary phosphonium ion.

7. The compound as in claim 5, wherein said M is nickel, palladium or platinum.

8. The compound as in claim 5, wherein (Cat) is selected from the group consisting of $(^nC_4H_9)_4P$, $(^nC_{16}H_{33}(^nC_4H_9)_3P)$ and 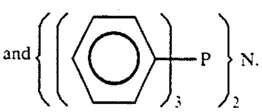

9. The compound as in claim 1, wherein the central metal has a valency of +3.

10. An infrared absorbent composition which comprises at least two metal complex compounds represented by the following general formula (IV)

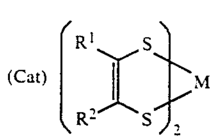

[IV]

wherein $R^1$ and $R^2$ each independently represents a hydrogen atom, cyano group or a substituted or unsubstituted alkyl, aryl or heterocyclic group, which may be the same or different; (Cat) represents a cation for neutralizing said complex; and M represents nickel, copper, cobalt, palladium or platinum.

11. The composition as in claim 10, wherein said cation for neutralizing said complex is a quaternary phosphonium ion.

12. The composition compound as in claim 10, wherein said M is nickel, palladium or platinum.

13. The composition compound as in claim 10, wherein said $R^1$ and $R^2$ each represents a cyano group.

14. The composition as in claim 10, wherein (Cat) is selected from the group consisting of $(^nC_4H_9)_4P$, $(^nC_{16}H_{33}(^nC_4H_9)_3P)$ and 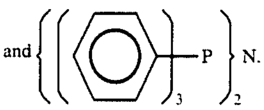

15. The infrared absorbent composition as in claim 10, further comprising a binder.

16. An infrared absorbing article which comprises a metal complex compound prepared by coordinating two bidentate ligands of the following formula (iii) to a center metal selected from the group consisting of nickel, copper, cobalt, palladium and platinum and neutralizing such a complex with a phosphonium cation

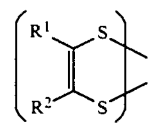

(iii)

wherein, $R^1$ and $R^2$ each independently represents a hydrogen atom, cyano group, or a substituted or unsubstituted alkyl, aryl or heterocyclic group, which may be the same or different.

17. The infrared absorbing article as in claim 16, which comprises (a) said metal complex compound in combination with a binder, or (b) said metal complex compound coated on a substrate.

18. The infrared absorbing article as in claim 17, wherein said binder is a film forming binder.

19. The infrared absorbing article as defined in claim 17, wherein 0.1-50 parts by weight of said infrared absorbent are used per 100 parts by weight of said binder.

20. The infrared absorbing article as in claim 16, further comprising an ultraviolet absorbent.

21. An infrared absorbing composition comprising a metal complex compound prepared by coordinating two bidentate ligands of the following formula (iii) to a center metal selected from the group consisting of nickel, copper, cobalt, palladium and platinum and neutralizing such a complex with a phosphonium cation

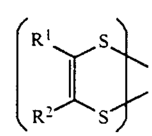

(iii)

wherein, $R^1$ and $R^2$ each independently represent a hydrogen atom, cyano group, or a substituted or unsubstituted alkyl, aryl or heterocyclic group, which may be the same or different, and a binder.

22. The infrared absorbent composition as in claim 21, wherein the central metal has a valency of +3.

23. An optical filter comprising the compound of claim 1.

* * * * *